(12) United States Patent
Yamada et al.

(10) Patent No.: US 7,140,084 B2
(45) Date of Patent: Nov. 28, 2006

(54) METHOD OF PRODUCING THIN FILM BULK ACOUSTIC RESONATOR

(75) Inventors: Tetsuo Yamada, Ube (JP); Keigo Nagao, Ube (JP); Chisen Hashimoto, Ube (JP)

(73) Assignee: UBE Industries, Ltd., Yamaguchi (JP)

( * ) Notice: Subject to any disclaimer, the term of this patent is extended or adjusted under 35 U.S.C. 154(b) by 0 days.

(21) Appl. No.: 10/995,447

(22) Filed: Nov. 23, 2004

(65) Prior Publication Data

US 2005/0093397 A1 May 5, 2005

Related U.S. Application Data

(62) Division of application No. 10/142,233, filed on May 9, 2002, now Pat. No. 6,842,088.

(30) Foreign Application Priority Data

| May 11, 2001 | (JP) | ............................. 2001-141845 |
| May 11, 2001 | (JP) | ............................. 2001-141848 |
| Jun. 15, 2001 | (JP) | ............................. 2001-182194 |

(51) Int. Cl.
*H04R 17/00* (2006.01)
*H05K 3/10* (2006.01)
*B24B 1/00* (2006.01)

(52) U.S. Cl. .................. 29/25.35; 29/846; 451/41; 977/888

(58) Field of Classification Search ............... 29/25.35, 29/846, 831, DIG. 19, DIG. 26; 451/36, 451/41; 438/53; 310/322, 324, 335, 349, 310/363; 333/186–192; 977/882, 888
See application file for complete search history.

(56) References Cited

U.S. PATENT DOCUMENTS 5,801,069 A * 9/1998 Harada et al. ............ 438/53 X

FOREIGN PATENT DOCUMENTS

JP 58153412 A 9/1983

(Continued)

OTHER PUBLICATIONS

Sugiyama et al., "Surface Micromachined Micro-Diaphragm Pressure Sensors", Solid State Sensors and Actuators, 1991, International Conference on Digest of Techical Transducers'91, pp. 188-191, Jun. 1991.*

*Primary Examiner*—A. Dexter Tugbang
(74) *Attorney, Agent, or Firm*—Frommer Lawrence & Haug LLP; Ronald R. Santucci

(57) ABSTRACT

A method of producing a thin film bulk acoustic resonator having a piezoelectric layer, a first electrode joined to a first surface of the piezoelectric layer, and a second electrode joined to a second surface of the piezoelectric layer, which is located at the opposite side to the first surface, including the steps of forming a pit on a surface of a substrate; filling the pit with a sacrificial layer; polishing a surface of the sacrificial layer so that the RMS variation of a height of the surface of the sacrificial layer is equal to 25 nm or less; forming the first electrode over a partial area of the surface of the sacrificial layer and a partial area of the surface of the substrate; forming the piezoelectric layer on the first electrode so that RMS variation of a height of the second surface of the piezoelectric layer is equal to 5% or less of a thickness of the piezoelectric layer; forming the second electrode on the piezoelectric layer; and removing the sacrificial layer from the inside of the pit by etching.

12 Claims, 12 Drawing Sheets

FOREIGN PATENT DOCUMENTS

| | | | |
|---|---|---|---|
| JP | 60142607 A | 7/1985 |
| JP | 02013109 A | 1/1990 |
| JP | 02309708 A | 12/1990 |
| JP | 6-232678 * | 8/1994 | ................ 29/25.35 |
| JP | 06295181 A | 10/1994 |
| JP | 2000069594 A | 3/2000 |

* cited by examiner

METHOD OF PRODUCING THIN FILM BULK ACOUSTIC RESONATOR

CROSS-REFERENCE TO RELATED APPLICATIONS

This application is a division of Ser. No. 10/142,233 now U.S. Pat. No. 6,842,088 issued Jan. 11, 2005 and filed May 9, 2002 entitled "Thin Film Bulk Acoustic Resonator and Method of Producing the Same," which claimed priority benefits from Japanese Patent Application No. 2001-141845 filed May 11, 2001, Japanese Patent Application No. 2001-141848 filed May 11, 2001, and Japanese Patent Application No. 2001-182194 filed Jun. 15, 2001, and which is incorporated herein by reference.

TECHNICAL FIELD

The present invention relates to a thin film bulk acoustic resonator using an electroacoustic effect of a piezoelectric thin film, and more particularly to a thin film bulk acoustic resonator usable as a constituent element of a filter for electronic circuits of communication equipment and a method of producing the same.

Further, the present invention relates to a device using a piezoelectric thin film used in a broad field such as a thin film oscillator, a thin film VCO (Voltage Control Oscillator), a thin film filter, a duplexer, various kinds of sensors, etc. used in mobile communication equipment or the like.

BACKGROUND TECHNIQUE

In order to meet the need of reducing the cost and size of electronic equipment, an effort of reducing the size of a filter as a circuit constituent element is being made continuously without changing its way. Strict requirements on both of the size and cost of constituent parts are imposed on consumer electronic equipment such as a cellular phone, miniature radio, etc. A circuit contained in such electronic equipment uses filters which must be tuned precisely to predetermined frequencies. Accordingly, an effort of supplying inexpensive and compact filters is being continuously made at every moment.

Devices using the piezoelectric phenomenon have been used in various fields. In the progress of miniaturization and power saving of portable equipment such as a cellular phone, etc., the application field of surface acoustic wave (SAW) devices as RF filters or IF filters used for the above equipment is being enlarged. Enhancement of the design and producing technologies of SAW filters have satisfied user's strict requirements to specifications. However, as the frequencies being used are shifted to a higher frequency band, the enhancement of the characteristics is approaching to its upper limit, so that great technical innovation has been required for both of the microstructure of electrodes to be formed and securement of stable output.

Further, a thin film acoustic resonator using the thickness vibration of piezoelectric thin film, that is, a thin film bulk acoustic resonator or a film bulk acoustic resonator (hereinafter referred to as "FBAR") is constructed by forming thin film mainly composed of piezoelectric element and electrodes for driving the piezoelectric thin film on a thin support film formed on a substrate. FBAR thus constructed can perform fundamental resonance in gigahertz band. If a filter is constructed by FBAR, the filter could be designed in a remarkably compact size, and also it can be operated with low loss and in a broad band. In addition, it can be manufactured integrally with a semiconductor integrated circuit. Therefore, it is expected that FBAR will be applied to future ultraminiature portable equipments.

A simple construction of the thin film bulk acoustic resonator has such a sandwich structure that a piezoelectric (PZ) thin film material layer is sandwiched between two metal electrodes. The sandwich structure is supported by a bridge structure in which the peripheral portion thereof is supported and the center portion thereof is suspended in the air. When electric field is generated by applying a voltage across the two electrodes, the piezoelectric (PZ) thin film material converts some of the electrical energy to mechanical energy in the form of acoustic wave. The acoustic wave propagates in the same direction as the electric field, and reflects at the interface between the electrode and the air. In the following description, the piezoelectric element may be abbreviated to PZ.

When mechanical resonance is induced, the thin film bulk acoustic resonator serves as an electrical resonator due to the electrical energy/mechanical energy converting property of the PZ thin film material. Accordingly, the filter can be constructed by the thin film bulk acoustic resonator. The mechanical resonance of the thin film bulk acoustic resonator is induced at the frequency at which the thickness of the material through which the acoustic wave propagates is equal to a half of the wavelength of the acoustic wave. The frequency of the acoustic wave is equal to the frequency of an electrical signal applied to the electrodes. The velocity of the acoustic wave is smaller than the velocity of light by 5 to 6 figures, and thus the resonator achieved can be made extremely compact. Therefore, the resonator to be used in the GHz band can be designed in the structure having a plane size less than 200 micrometers and a thickness less than several micrometers.

In the thin film bulk acoustic resonator and stacked thin film acoustic resonators having a plurality of the sandwich structures as described above, that is, stacked thin film bulk acoustic wave resonators and filters (hereinafter referred to as "SBAR"), the center portion of the sandwich structure comprises piezoelectric thin film which is manufactured to have a thickness of about 1 to 2 μm by the sputtering method. The upper and lower electrodes act as electrical leads and are disposed so as to sandwich the piezoelectric thin film therebetween to give electrical field penetrating through the piezoelectric thin film. The piezoelectric thin film converts a part of the electric field energy to mechanical energy. In response to the applied electric field energy which varies with time, the time-varying (stress/strain) energy is formed.

A piezoelectric thin film element applied to a resonator, a filter or the like which uses such elastic wave is manufactured as follows.

By using various thin film forming methods, a base film comprising a dielectric thin film, a conductive thin film or a stacked film of the dielectric thin film and the conductive thin film is formed on the surface of a single crystal semiconductor substrate of silicon or the like or on the surface of a substrate constructed by forming polycrystalline diamond film or film of isoelastic metal such as elinvar or the like on silicon wafer or the like. Further, piezoelectric thin film is formed on the base film, and a desired upper structure is formed. After each film is formed or after all the films are formed, each film is subjected physical processing or chemical processing to perform micro-fabrication and patterning.

In order to operate FBAR or SBAR as a thin film bulk acoustic resonator, the sandwich structure containing the piezoelectric thin film must be supported by the bridge structure so that the air/crystal interface is formed to confine the acoustic wave in the sandwich structure. The sandwich structure is generally constructed by stacking a lower electrode, a piezoelectric layer and an upper electrode in this order. Accordingly, the air/crystal interface has already existed at the upper side of the sandwich structure. In addition, the air/crystal interface must be also formed at the lower side of the sandwich structure. In order to achieve the air/crystal interface at the lower side of the sandwich structure, the following methods have been hitherto used.

According to a first method, as disclosed in JP(A)-58-153412 or JP(A)-60-142607 for example, etching away a part of wafer which constitutes a substrate is used. In the case where the substrate is composed of silicon, a part of the silicon substrate is etched away from the back side thereof by using heated KOH water solution to form a hole. That is, after a base film, a lower electrode, a piezoelectric thin film and an upper electrode are formed on the upper surface of the substrate, a portion of the substrate located below a portion which will act as an oscillating portion is removed from the lower surface side of the substrate, thereby achieving a resonator having such a shape that the edge of the sandwich structure is supported by the silicon substrate at a portion surrounding the hole at the front surface side of the silicon substrate. However, the hole thus formed so as to penetrate through the wafer makes the wafer very fragile and easily breakable. Further, if wet etching using KOH is carried out at an etching inclination angle of 54.7 degrees with respect to the surface of the substrate, it would be difficult to increase the achievement amount of final products, that is, to increase the yield of FBAR/SBAR on wafer.

For example, the sandwich structure having a lateral dimension of about 150 μm×150 μm (plane size) which is formed on silicon wafer having a thickness of 250 μm needs a back-side etching hole of about 450 μm×450 μm. Accordingly, about only one ninth of wafer can be used for manufacturing. After a portion of the substrate located below the oscillation portion of the piezoelectric thin film is removed by anisotropic etching to form a floating structure, the wafer is separated every element to achieve thin film bulk acoustic resonators (which are also called as piezoelectric thin film resonators) corresponding to the PZ thin film elements.

According to a second method of providing the air/crystal interface below the sandwich structure, as disclosed in JP(A)-2-13109, an air bridge type FBAR element is formed. Normally, a sacrificial layer is formed, and then a sandwich structure is formed on the sacrificial layer. The sacrificial layer is removed at the end of the process or about the end of the process. The overall processing is carried out at the front surface side of wafer, and thus this method needs no positioning at the both sides of the wafer and no large-area back-side opening.

JP(A)-2000-69594 discloses the construction of an air bridge type FBAR/SBAR and a method of manufacturing the same using phospho-silicate glass (PSG) as a sacrificial layer. In this publication, a PSG layer is deposited on silicon wafer. PSG is deposited at a temperature of about 450° C. or less by using silane and $P_2O_2$ to form soft-glass-like substance containing a phosphorus content of about 8%. PSG can be deposited at a relatively low temperature, and it can be etched at a very high rate with dilute $H_2O$:HF water solution.

It is described in this publication that variation of RMS (root mean square) of the height indicating the surface roughness of the PSG sacrificial layer is less than 0.5 μm,
however, there is no description on RMS variation of an order of 0.1 μm or less. The 0.1 μm-order RMS variation is very roughly uneven at the atomic level. An FBAR/SBAR type thin film bulk acoustic resonator needs a piezoelectric material whose crystal is grown as prismatic crystal vertical to the plane of the electrode.

In JP(A)-2000-69594, it is described that a conductive sheet parallel to the surface of the PSG layer is formed, and the RMS variation of the height of the conductive sheet is less than 2 μm, however, there is no specific description on the RMS variation of an order of 0.1 μm or less. The 0.1 μm-order RMS variation is an insufficient surface roughness for the surface on which piezoelectric thin film for a thin film bulk acoustic resonator is formed. Various attempts to grow the piezoelectric thin film have been made. However, the crystal is grown in various directions due to the effect of various unevenness on the rough surface, so that the crystal quality of the piezoelectric thin film achieved is not sufficient.

There is a method of providing a proper solid acoustic mirror in place of provision of the air/crystal interface as described above. According to this method, as disclosed in JP(A)-6-295181, a large acoustic impedance comprising an acoustic Bragg reflection mirror is formed below the sandwich structure. The Bragg reflection mirror is formed by alternately stacking layers of high and low acoustic impedance materials. The thickness of each layer is fixed to one fourth of the wavelength of the resonant frequency. A sufficient number of layers enables the effective impedance at the interface between the piezoelectric element and the electrode to be still higher than the acoustic impedance of the element. Accordingly, the acoustic wave in the piezoelectric element can be confined effectively. An acoustic resonator achieved according to this method is called as solid acoustic mirror mounted resonator (SMR) because there is no cavity below the sandwich structure.

This method can avoid the problem of the first and second methods that there is formed such a film that the peripheral portion thereof is fixed and the center portion thereof is freely vibrated. However, this method has many problems. That is, since a metal layer forms a parasitic capacitor which degrades the electrical performance of the filter, it cannot be used as the layer of the Bragg reflection mirror. Therefore, selection of materials usable for the Bragg reflection mirror is restricted. The difference in acoustic impedance between layers formed of available materials is not large. Accordingly, a number of layers are needed to confine the acoustic wave. Further, in this method, stress applied to each layer must be controlled with high precision, and thus the manufacturing process is complicated.

Further, it is difficult to form a viahole penetrating a large number of layers such as the number of 10 to 14, and thus the acoustic resonators achieved according to this method are unfavorable to integration with other active elements. Further, according to examples which have been ever reported, the acoustic resonators achieved according to this method have effective coupling coefficients still lower than those of the acoustic resonators having air bridges. As a result, the filter based on SMR has a narrower effective band width than the filter using the air bridge type acoustic resonator.

As described above, in the thin film bulk acoustic resonator, (stress/strain) energy that varies with time in response to time-varying applied electric field energy is formed in the sandwich structure. Accordingly, when the adhesion force between the substrate and the lower electrode of the sandwich structure is low, the substrate and the sandwich structure are exfoliated from each other, so that durability is lowered, that is, the lifetime of the thin film bulk acoustic resonator is shortened.

In JP(A)-2000-69594, etc., Mo is described as proper electrode material. However, there is no specific description on enhancement of adhesion force to silicon wafer, etc. serving as a substrate.

For example, JP(A)-2-309708 discloses that a lower electrode layer comprising two layers of Au/Ti or the like is used. In this case, the Ti layer exists as a layer for increasing the adhesion force between the Au layer and the substrate. That is, the Ti adhesion layer is not an indispensable electrode layer from the viewpoint of the original operation of the thin film bulk acoustic resonator. However, when no Ti adhesion layer is formed and only the Au electrode layer is solely formed, the adhesion force between the substrate and the Au electrode layer is insufficient, and occurrence of exfoliation, etc. remarkably reduces the durability of the thin film bulk acoustic resonator under operation.

In the thin film bulk acoustic resonators as described above, there exist not only required longitudinal vibration propagating in the direction vertical to the electrode surface, but also lateral vibration propagating in the direction parallel to the electrode surface. The lateral vibration contains a component that causes "spurious" in the required vibration of the thin film bulk acoustic resonator to degrade the characteristics of the resonator.

An object of the present invention is to provide FBAR/SBAR having improved performance.

Another object of the present invention is to provide a high-performance FBAR/SBAR that is excellent in electromechanical coupling coefficient, acoustic quality factor (Q-value), temperature characteristic, etc. by improving the crystal quality of piezoelectric (PZ) thin film.

Another object of the present invention is to provide a high-performance FBAR/SBAR that is excellent in electromechanical coupling coefficient, acoustic quality factor (Q-value), temperature characteristic, etc. by devising the shape of an upper electrode.

Another object of the present invention is to provide a high-performance FBAR/SBAR in which particularly spurious resonance is reduced.

Another object of the present invention is to improve durability of FBAR/SBAR and thus improve the lifetime thereof by increasing the adhesion force (bonding strength) between a lower electrode layer and a substrate.

Another object of the present invention is to provide a high-performance FBAR/SBAR that is excellent in electromechanical coupling coefficient, acoustic quality factor (Q-value), etc. by increasing the adhesion force between the lower electrode layer and the substrate and enabling formation of piezoelectric thin film having excellent crystal quality and orientation on the lower electrode layer.

As the piezoelectric materials for piezoelectric thin film elements are used aluminum nitride (AlN), zinc oxide (ZnO), cadmium sulfide (CdS), lead titanate [PT] ($PbTiO_3$), lead titanate zirconate [PZT] ($Pb(Zr,Ti)O_3$), etc. Particularly, AlN has higher propagation speed of elastic wave, and it is suitably used as piezoelectric material of piezoelectric thin film resonator for a thin film bulk acoustic resonator or filter which operate in a high-frequency band.

FBAR achieves resonance by elastic wave propagating in the thin film, so that not only the vibration characteristic of the piezoelectric thin film, but also the vibration characteristics of the electrode layer and the base film greatly affect the resonance characteristic of FBAR. Various attempts have been hitherto made to apply the AlN thin film to FBAR.

However, there have not yet achieved any thin film bulk acoustic resonator and any thin film filter which can exhibit sufficient performance in GHz band. Accordingly, there has been strongly required a piezoelectric thin film resonator, that is, a thin film bulk acoustic resonator in which the electromechanical coupling coefficient, acoustic quality factor and the temperature stability of the resonant frequency of a vibration portion containing not only the AlN thin film but also an electrode layer and a base film are improved.

Therefore, the present invention has an object to provide a piezoelectric thin film resonator, that is, a thin film bulk acoustic resonator in which the temperature stability of the resonant frequency is improved without reducing the electromechanical coupling coefficient and acoustic quality factor by taking advantage of the characteristic of the AlN thin film with high propagation velocity of elastic wave.

SUMMARY OF THE INVENTION

In order to attain the above objects, according to the present invention, there is provided a thin film bulk acoustic resonator, comprising: a piezoelectric layer; a first electrode joined to a first surface of the piezoelectric layer; and a second electrode joined to a second surface of the piezoelectric layer, which is located at the opposite side to the first surface, wherein RMS variation of the height of the first surface of the piezoelectric layer is equal to 25 nm or less, preferably to 20 nm or less.

In the present invention, the RMS variation of the height means the root-mean-square roughness: Rq described in Japanese Industrial Standard JIS B-0601: 2001 "Geometrical Properties Specification (GPS) of Products—Surface Property: Outlook Curved Line System—Term, Definition and Surface Property Parameter" (the same is applied to the invention described below).

Further, according to the present invention, in order to achieve the above object, there is provided a thin film bulk acoustic resonator, comprising: a piezoelectric layer; a first electrode joined to a first surface of the piezoelectric layer; and a second electrode joined to a second surface of the piezoelectric layer, which is located at the opposite side to the first surface, wherein a surface of the first electrode facing the piezoelectric layer has RMS variation of the height thereof that is equal to 25 nm or less, preferably to 20 nm or less.

In an aspect of the present invention, RMS variation of the height of the second surface of the piezoelectric layer is set to not more than 5% of the thickness of the piezoelectric layer. In an aspect of the present invention, waviness height of a surface of the second electrode is set to not more than 25% of the thickness of the piezoelectric layer.

In an aspect of the present invention, the second electrode has a center portion and an outer peripheral portion having a larger thickness than the center portion. In an aspect of the present invention, the outer peripheral portion is located in a frame shape so as to surround the center portion. In an aspect of the present invention, the second electrode is designed so that thickness variation of the center portion is set to not more than 1% of the thickness of the center portion. In an aspect of the present invention, the thickness of the outer peripheral portion is set to not less than 1.1 time as high as the height of the center portion. In an aspect of the present invention, the outer peripheral portion is located within an area inwardly extending from an outer edge of the second electrode by a distance of 40 μm. In an aspect of the present invention, waviness height of a surface of the center portion is set to not more than 25% of the thickness of the piezoelectric layer.

In an aspect of the present invention, a sandwich structure comprising the piezoelectric layer, the first electrode and the second electrode is supported at an edge portion thereof by the substrate so as to stride over a pit or cavity or recess formed on a surface of the substrate. In an aspect of the present invention, an insulating layer is formed on the surface of the substrate so as to stride over the pit portion, and the sandwich structure is formed on the insulating layer.

Further, according to the present invention, in order to attain the above object, there is provided a method of producing a thin film bulk acoustic resonator having a piezoelectric layer, a first electrode joined to a first surface of the piezoelectric layer, and a second electrode joined to a second surface of the piezoelectric layer, which is located at the opposite side to the first surface, comprising: forming a pit or cavity or recess on a surface of a substrate; filling the pit with a sacrificial layer; polishing a surface of the sacrificial layer so that RMS variation of the height of the surface of the sacrificial layer is equal to 25 nm or less, preferably to 20 nm or less; forming the first electrode over a partial area of the surface of the sacrificial layer and a partial area of the surface of the substrate; forming the piezoelectric layer on the first electrode; forming the second electrode on the piezoelectric layer; and removing the sacrificial layer from the inside of the pit by etching.

In an aspect of the present invention, the first electrode is formed at a thickness of 150 nm or less, and RMS variation of the height of an upper surface of the first electrode is set to 25 nm or less, preferably to 20 nm or less.

In an aspect of the present invention, an insulating layer is formed before the first electrode is formed on the sacrificial layer.

Still further, according to the present invention, there is provided a thin film bulk acoustic resonator, comprising: a substrate; and a sandwich structure disposed on the substrate and having a piezoelectric thin film layer (piezoelectric layer), a lower electrode layer at the substrate side and an upper electrode layer paired with the lower electrode layer, which are stacked so that the piezoelectric thin film layer is sandwiched between the lower electrode layer and the upper electrode layer, wherein the sandwich structure has an adhesion electrode layer or adherence electrode layer located between the lower electrode layer and the substrate and joined to the lower electrode layer, and the adhesion electrode layer is joined to the substrate around a pit or cavity or recess which is formed on the substrate so as to permit vibration of the sandwich structure.

In an aspect of the present invention, the adhesion electrode layer is formed in an annular shape, and when a plane area of a portion of the adhesion electrode layer which is brought into contact with the lower electrode layer is represented by S1 and a plane area of the lower electrode layer is represented by S2, the relationship: $0.01 \times S2 \leq S1 \leq 0.5 \times S2$ is satisfied, and the upper electrode layer is located in an area corresponding to the inside of the adhesion electrode layer.

In an aspect of the present invention, the adhesion electrode layer comprises material containing at least one material selected from a group consisting of Ti, Cr, Ni and Ta, the lower electrode layer comprises material containing at least one material selected from a group consisting of Au, Pt, W and Mo, and the piezoelectric thin film layer is formed of AlN or ZnO.

Still further, according to the present invention, there is provided a method of producing the thin film bulk acoustic resonator, comprising: forming the adhesion electrode layer on the surface of the substrate having the pit so that the adhesion electrode layer is located around the pit; forming a sacrificial layer on the surface of the substrate so that the sacrificial layer is located in an area corresponding to the pit located at the inside of the adhesion electrode layer; polishing a surface of the sacrificial layer so that RMS variation of the height thereof is equal to 25 nm or less, preferably to 20 nm or less; successively forming the lower electrode layer, the piezoelectric thin film layer and the upper electrode layer on the sacrificial layer and the adhesion electrode layer; and then removing the sacrificial layer.

In an aspect of the present invention, the sacrificial layer is formed by forming a layer of sacrificial layer material so that the substrate and the adhesion electrode layer are covered by the layer of the sacrificial layer material, and polishing the layer of the sacrificial layer material so that the surface of the adhesion electrode layer is exposed, and the sacrificial layer is removed by etching, and glass or plastic material is used for the sacrificial layer.

The inventors have discovered that the temperature stability of resonance frequencies can be improved with keeping high electromechanical coupling coefficient and high acoustic quality factor by forming electrodes on both the surfaces of a piezoelectric thin film which is mainly formed of AlN, the electrodes being mainly formed of molybdenum (Mo) that has larger elastic modulus than general electrode materials such as gold, platinum, aluminum, copper, etc. and remarkably small thermal elasticity loss, and further forming an insulating layer mainly containing silicon oxide ($SiO_2$) or silicon nitride ($Si_3N_4$) having a temperature coefficient of resonant frequency whose sign is different from the temperature coefficient of resonant frequency of the piezoelectric thin film while the insulating layer is contained in the vibration portion, and have implemented the present invention on the basis of this discovery. Further, the inventors have also discovered that high-performance FBAR having high electromechanical coupling coefficient and high acoustic quality factor and remarkably excellent temperature stability can be implemented by setting the thickness of each layer so as to satisfy $0.1 \leq t'/t \leq 0.5$, preferably $0.2 \leq t'/t \leq 0.4$ wherein the thickness of the piezoelectric thin film mainly formed of aluminum nitride is represented by t and the thickness of the insulating layer mainly formed of silicon oxide or silicon nitride (when there are plural insulating layers, "thickness" means the total thickness of the respective insulating layers) is represented by t'.

That is, according to the present invention, in order to attain the above object, there is provided a piezoelectric thin film resonator, comprising: a substrate; and a piezoelectric stack structure formed on the substrate in which a vibrating portion is constructed to contain a part of the piezoelectric stack structure, the piezoelectric stack structure is formed by stacking a lower electrode, a piezoelectric film (piezoelectric layer) and an upper electrode in this order from the substrate side, and a cavity for permitting vibration of the vibrating portion is formed in the substrate in an area corresponding to the vibrating portion, wherein the piezoelectric film is mainly formed of aluminum nitride, the lower electrode and the upper electrode are mainly formed of molybdenum, and the vibrating portion contains at least a part of at least one insulating layer mainly formed of silicon oxide or silicon nitride which is joined to the piezoelectric stack structure. It should be noted that the terms "piezoelectric thin film resonator" and "thin film bulk acoustic resonator" have the same meaning in this specification.

In an aspect of the present invention, the thickness t of the piezoelectric film and the total thickness t' of at least one insulating layer satisfies the following inequality: $0.1 \leq t'/t \leq 0.5$. Here, in case of one insulating layer, the total thickness t' means the thickness thereof, and, in case of plural insulating layers, the total thickness t' means the sum of the thickness of the respective insulating layers.

In an aspect of the present invention, the content of aluminum nitride in the piezoelectric film is set to 90 equivalent % or more. In an aspect of the present invention, the content of silicon oxide or silicon nitride in the insulating layer is set to 50 equivalent % or more. In an aspect of the present invention, the content of molybdenum in each of the lower electrode and the upper electrode is set to 80 equivalent % (atomic %) or more.

In an aspect of the present invention, one of the at least one insulating layer is formed on the surface of the substrate. In an aspect of the present invention, one of the at least one insulating layer is formed on a surface of the piezoelectric stack structure at the opposite side to the substrate.

In an aspect of the present invention, the substrate is formed of single crystal silicon. In an aspect of the present invention, the upper electrode comprises a first electrode portion and a second electrode portion that are formed so as to be spaced from each other.

In an aspect of the present invention, the electromechanical coupling coefficient determined on the basis of the measurement values of the resonance frequency and the antiresonance frequency in the neighborhood of 2.0 GHz is equal to 4.0 to 6.5%, and the acoustic quality factor thereof is equal to 750 to 2000, and the temperature coefficient of the resonance frequency is equal to −20 to 20 ppm/° C.

Further, according to the present invention, there are provided a VCO (voltage control oscillator), a filter and a transmission/reception duplexer which are constructed by using the piezoelectric thin film resonator described above, and the characteristics can be remarkably improved at high frequencies of 1 GHz or more in these devices.

DETAILED DESCRIPTION OF THE PREFERRED EMBODIMENTS

Preferred embodiments according to the present invention will be described hereunder with reference to the accompanying drawings.

Figure 1:
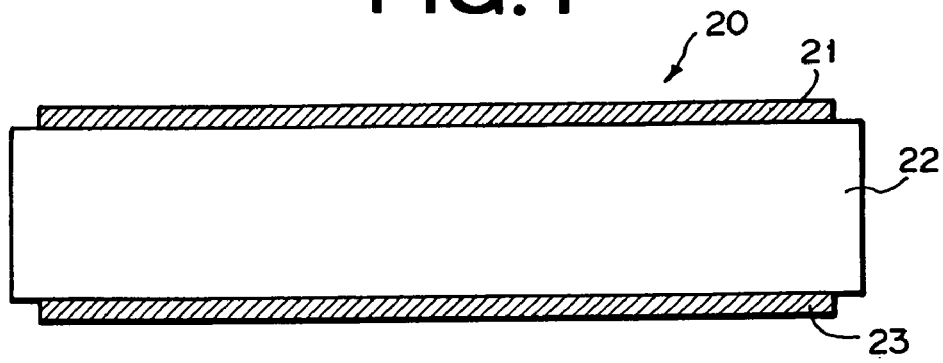
FIG. 1 is a schematic cross-sectional view showing the basic construction of FBAR which is a thin film bulk acoustic resonator according to the present invention.
Figure 2:
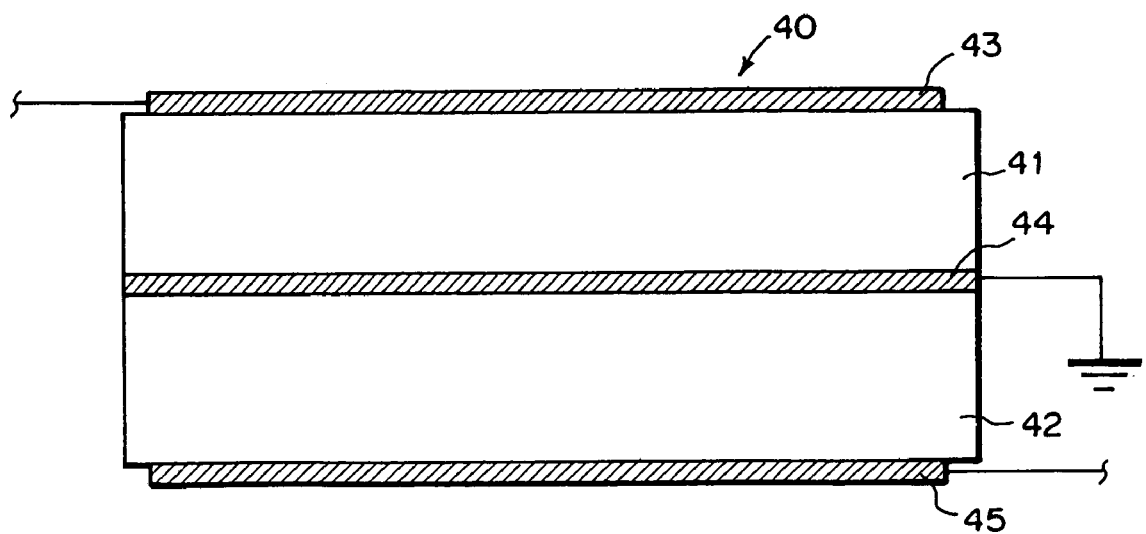
FIG. 2 is a schematic cross-sectional view showing the basic construction of SBAR which is a thin film bulk acoustic resonator according to the present invention.

FIGS. 1 and 2 are schematic cross-sectional views showing the basic construction of each of FBAR and SBAR which is a thin film bulk acoustic resonator according to the present invention.

In FIG. 1, FBAR 20 comprises an upper electrode 21 and a lower electrode 23, and a piezoelectric (PZ) material layer 22 which is partially sandwiched between the upper and lower electrodes 21 and 23, thereby forming a sandwich structure. Aluminum nitride (AlN) or zinc oxide (ZnO) is preferably used as the PZ material. The electrodes 21, 23 used for FBAR 20 are preferably formed of molybdenum, however, they may be formed of other materials.

This device (FBAR) utilizes the action of bulk elastic acoustic wave in the thin film of PZ material. When electric field is generated between the two electrodes 21, 23 by applying a voltage across them, the PZ material converts a part of electrical energy to mechanical energy in the form of acoustic wave. The acoustic wave propagates in the same direction as the electric field, and is reflected at the electrode/air interface.

When mechanically resonating, the acoustic resonator plays a role as an electrical resonator by the electrical energy/mechanical energy converting property of the PZ material. Accordingly, the device can operate as a notch filter. The mechanical resonance of the device occurs at the frequency at which the thickness of the material through which the acoustic wave propagates is equal to the half wavelength of the acoustic wave. The frequency of the acoustic wave is equal to the frequency of an electrical signal applied between the electrodes 21, 23. Since the velocity of sound is smaller than the velocity of light by five to six figures, the resonator thus achieved can be designed to be extremely compact. The resonators to be applied in the GHz band can be constructed in the plane size of about 100 µm order and in the thickness of several micrometers order.

Next, SBAR will be described with reference to FIG. 2. SBAR 40 has an electrical function similar to a band filter. SBAR 40 basically corresponds to two mechanically-coupled FBARs. A signal traversing the electrodes 43 and 44 at the resonance frequency of the piezoelectric layer 41 transmits the acoustic energy to the piezoelectric layer 42. The mechanical vibration in the piezoelectric layer 42 is converted to an electrical signal traversing the electrodes 44 and 45.

FIGS. 3 to 8 are schematic cross-sectional views (FIGS. 3 to 6 and 8) and a schematic plan view (FIG. 7) showing a method of producing or manufacturing FBAR (thin film bulk acoustic resonator) and an embodiment of FBAR thus achieved.

Figure 3:
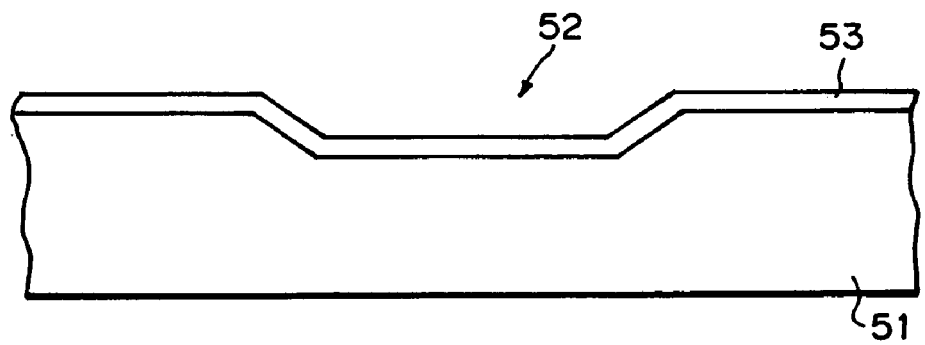
FIG. 3 is a schematic cross-sectional view showing a method of producing FBAR (thin film bulk acoustic resonator) according to the present invention, and an embodiment of FBAR thus achieved.

First, as shown in FIG. 3, a pit or cavity or recess is formed by etching in a typical silicon wafer 51 used for manufacturing an integrated circuit. The depth of the pit is preferably set to 1.5 to 30 µm, more preferably to 1.5 to 10 µm or to 3 to 30 µm as occasion demands. It is sufficient that the depth of a cavity below the sandwich structure of FBAR may be set to several micrometers in consideration of the fact that the cavity is merely used to allow displacement induced in the piezoelectric layer.

A thin layer 53 of silicon oxide is formed on the surface of the wafer 51 by thermal oxidation so that phosphorus of a sacrificial layer of PSG which will be formed on the thin layer 53 in a subsequent step is prevented from being diffused into the wafer 51. In place of the silicon oxide layer, a silicon nitride-layer formed by the low pressure CVD method may be used as the thin layer 53. By suppressing the diffusion of phosphorus into the wafer as described above, the silicon wafer can be prevented from being converted to conductive material, and thus the electrical action of the device thus achieved can be prevented from being adversely effected. The wafer 51 on which the thin layer 53 of silicon oxide or silicon nitride is formed is used as the substrate. That is, FIG. 3 shows a state that a pit or cavity or recess 52 is formed on the surface of the substrate to have a depth of preferably 1.5 to 30 µm, more preferably 1.5 to 10 µm or 3 to 30 µm as occasion demands.

Figure 4:
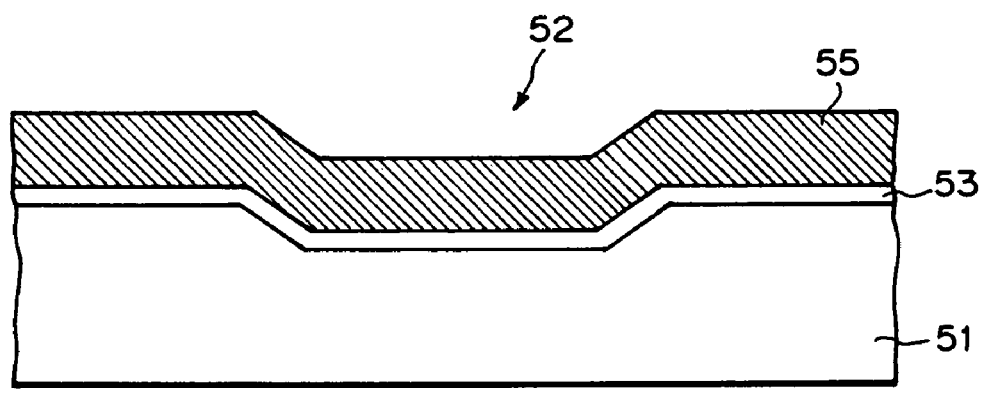
FIG. 4 is a schematic cross-sectional view showing the method of producing FBAR (thin film bulk acoustic resonator) according to the present invention, and the embodiment FBAR thus achieved.

Next, as shown in FIG. 4, a phospho-silicate glass (PSG) layer 55 is deposited on the thin layer 53 of silicon oxide or silicon nitride of the substrate. PSG is deposited at a temperature of about 450° C. or less by using silane and $P_2O_5$ source as raw materials to form soft-glass-like material containing about 8% phosphorus. As examples of silane may be used monosilane ($SiH_4$), trichlorosilane ($SiHCl_3$), silicon tetramethoxide ($Si(OCH_3)_4$), silicon tetraethoxide ($Si(OC_2H_5)_4$), etc. As examples of the material serving as the $P_2O_5$ source may be used phosphine ($PH_3$), trimethyl phosphite ($P(OCH_3)_3$), triethyl phosphite ($P(OC_2H_5)_3$), trimethyl phosphate ($PO(OCH_3)_3$), triethyl phosphate ($PO(OC_2H_5)_3$), etc. as well as $P_2O_5$.

This low-temperature process is well known to persons skilled in the art. Since PSG is a very clean inactive material which can be deposited at a relatively low temperature and etched at a very high etching rate with dilute $H_2O$:HF solution, it is preferably used as the material of the sacrificial layer. In the etching step executed in the subsequent process, an etching rate of about 3 µm per minute can be achieved at a dilute ratio of 10:1.

The surface of the PSG sacrificial layer 55 thus deposited would be very rough at the atomic level if it is left as it is. Accordingly, the PSG sacrificial layer 55 as deposited is insufficient as a base body to form an acoustic resonator. An FBAR/SBAR type bulk acoustic resonator needs piezoelectric material whose crystal is grown with forming prismatic or columnar crystal vertical to the electrode surface. The surface of the PSG sacrificial layer 55 is polished to be smoothened with use of polishing slurry containing fine polishing particles to form a thin film of piezoelectric material having excellent crystallinity and orientation.

Figure 5:
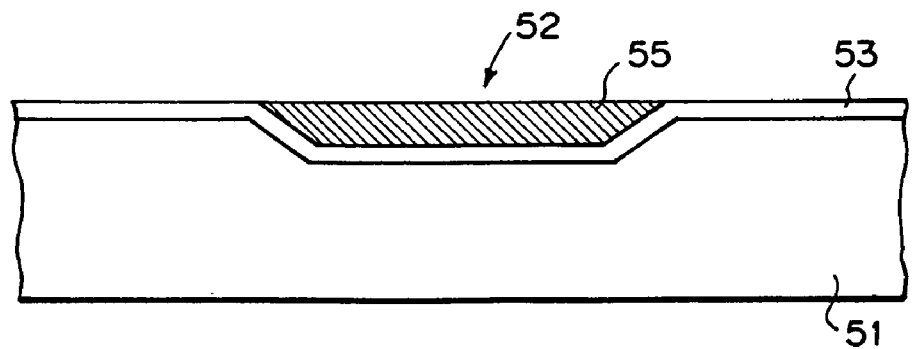
FIG. 5 is a schematic cross-sectional view showing the method of producing FBAR (thin film bulk acoustic resonator) according to the present invention, and the embodiment of FBAR thus achieved.

That is, by polishing the surface of the PSG layer 55 with roughly finishing slurry as shown in FIG. 5, the overall surface of the PSG layer 55 is flattened or planarized and a portion of the PSG layer at the outside of the pit 52 is removed. Subsequently, the remaining PSG layer 55 is further polished with slurry containing fine polishing particles. As a substitute method, the above two polishing steps may be executed by using one fine slurry if further polishing time is allowed. The target is mirror-like finishing.

In the present invention, before the PSG layer is polished, it is preferable to subject the PSG layer to heat treatment at high temperature for the purpose of densification and reflow. The heat treatment of the PSG layer may be performed by RTA (Rapid Thermal Anneal) method. This is carried out at a temperature range from 750° C. to 950° C. under nitrogen atmosphere or nitrogen-oxygen mixture atmosphere. Alternatively, the high-temperature heat treatment may be carried out in a diffusion furnace or by lamp heating. In the present invention, by subjecting the PSG layer to the high-temperature heat treatment, the PSG layer can be designed to have a more densified structure and the hardness thereof is increased. By increasing the hardness of the PSG layer, polishing damage such as scratch or the like is prevented from occurring on the surface of the PSG film in the subsequent CMP (Chemical Mechanical Polishing), and the surface of the PSG film can be excellently flattened.

It is important to clean the substrate on which the PSG layer 55 remains at the position corresponding to the pit 52 as described above. The slurry causes a slight amount of silica coarse grain to remain on the wafer. Accordingly, the coarse grain must be removed. In a preferred embodiment of the present invention, the removal of the coarse grain is carried out by using a second polishing tool having a rigid pad such as Polytex (trademark) produced by Rodel Nitta Incorporated Company. In this case, deionized water is used as lubricant, and the wafer is immersed in the deionized water from the time when the substrate has been polished until the time when the standby of the final cleaning step is completed. It should be noted that the substrate is prevented from being dried from the last polishing step to the final cleaning step. The last cleaning step comprises a step of immersing the substrate into a series of tanks which are charged with various chemicals. Ultrasonic stirring is applied to each tank. Such cleaning means is known to persons skilled in the art.

The polishing material is formed of silica fine particles. In the preferred embodiment of the present invention, ammonia-based slurry of silica fine particle (Rodel Klebosol#30N: Rodel Nitta Incorporated Company) is used as the polishing material.

In the foregoing description, the specific polishing and cleaning manners are described. However, any polishing and cleaning manners may be used insofar as they can give required smooth surface. In the preferred embodiment of the present invention, with respect to the finished surface, the RMS variation of the height of the surface which is measured by an atomic force microscope probe is equal to 25 nm or less (preferably 20 nm or less).

Figure 6:
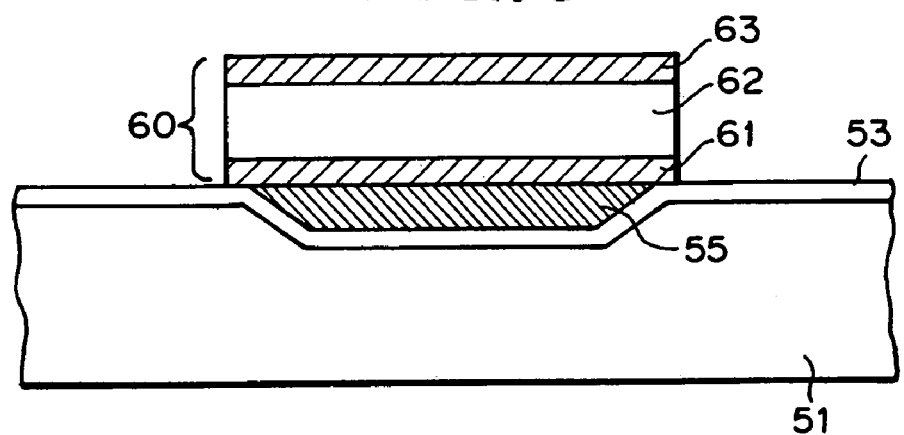
FIG. 6 is a schematic cross-sectional view showing the method of producing FBAR (thin film bulk acoustic resonator) according to the present invention, and the embodiment of FBAR thus achieved.

After the surface is cleaned as described above, a lower electrode 61 of the sandwich structure 60 is deposited as shown in FIG. 6. Molybdenum (Mo) is a preferable material for the lower electrode 61. However, the lower electrode 61 may be formed of other material such as Al, W, Au, Pr or Ti. Molybdenum (Mo) is preferable because it has low thermoelastic loss. For example, the thermoelastic loss of Mo is equal to about 1/56 of that of Al.

The thickness of the lower electrode 61 is important. A thick layer has a rougher surface than a thin layer. It is important for the performance of the resonator achieved to keep the smooth surface for deposition of the piezoelectric layer 62. Accordingly, the thickness of the lower electrode is preferably equal to 150 nm or less. Mo is preferably deposited by sputtering. In the above step is achieved an Mo layer in which the RMS variation of the height of the surface is equal to 25 nm or less (preferably 20 nm or less).

After the deposition of the lower electrode 61 is finished, the piezoelectric layer 62 is deposited. The preferable material of the piezoelectric layer 62 is AlN or ZnO, and it is deposited by sputtering. In the preferred embodiment of the present invention, the thickness of the piezoelectric layer 62 is set to a value in the range from 0.1 μm to 10 μm (preferably 0.5 μm to 2 μm). With respect to the upper surface of the piezoelectric layer 62, the RMS variation of the height is preferably equal to 5% or less of the thickness (average value) of the piezoelectric layer.

Finally, an upper electrode 63 is deposited. The upper electrode 63 is formed of the same material as the lower electrode 61, and it is preferably formed of Mo.

Figure 7:
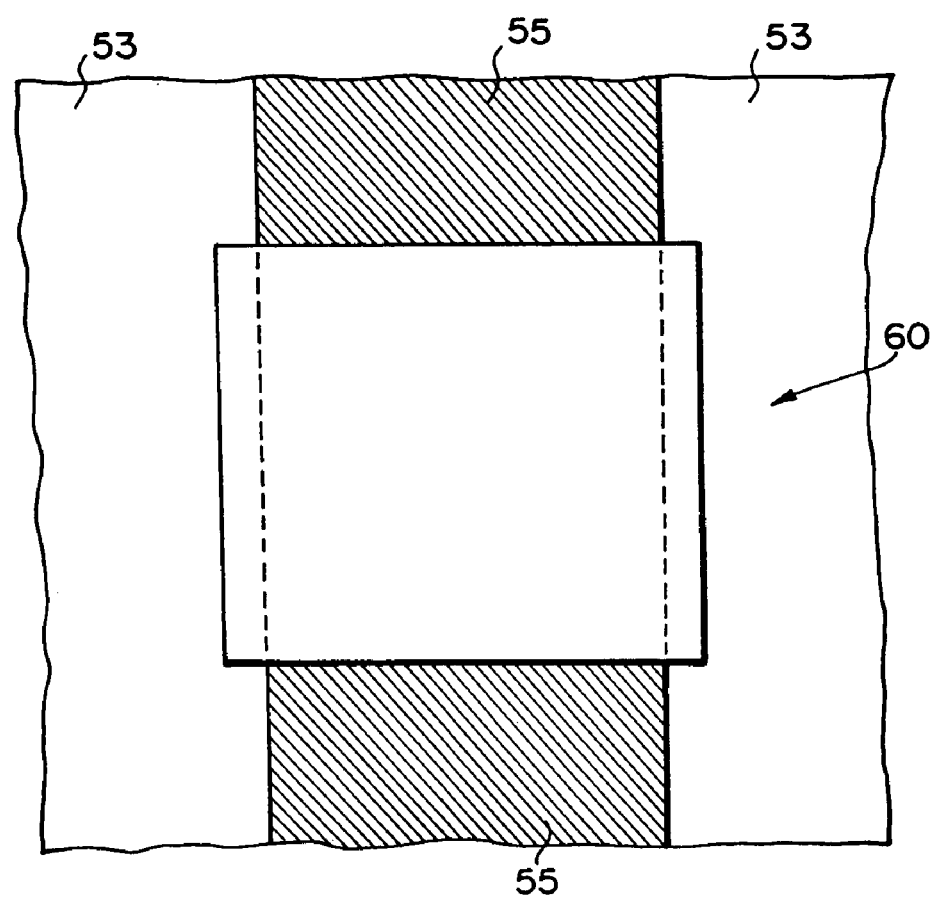
FIG. 7 is a schematic plan view showing the method of producing FBAR (thin film bulk acoustic resonator) according to the present invention, and the embodiment of FBAR thus achieved.
Figure 8:
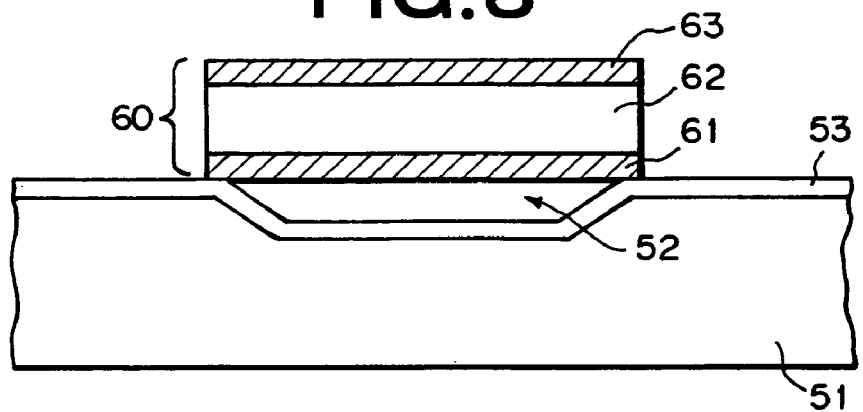
FIG. 8 is a schematic cross-sectional view showing the method of producing FBAR (thin film bulk acoustic resonator) according to the present invention, and the embodiment of FBAR thus achieved.

After the sandwich structure 60 that comprises the lower electrode 61, the piezoelectric layer 62 and the upper electrode 63 is formed and is patterned in a desired shape as described above, the etching using dilute $H_2O$:HF solution is started from the edge portion of the sandwich structure 60 or a portion of the sacrificial layer 55 which is not covered by the sandwich structure 60 and thus exposed to the outside as shown in FIG. 7, thereby removing PSG below the sandwich structure 60. Accordingly, the sandwich structure 60 suspended over the pit 52 remains as shown in FIG. 8. That is, the edge portion of the sandwich structure 60 is supported on the substrate so as to stride over the pit 52 formed on the surface of the substrate.

In FBAR thus achieved, according to the surface of the sacrificial layer 55 (the RMS variation of the height is equal to 25 nm or less (preferably 20 nm or less)), the RMS variation of the height of the lower surface of the lower electrode 61 formed on the sacrificial layer 55 is equal to 25 nm or less (preferably 20 nm or less). Further, since the thickness of the lower electrode 61 is small, the RMS variation of the height of the upper surface thereof is equal to 25 nm or less (preferably 20 nm or less). According to the upper surface of the lower electrode 61, the RMS variation of the height of the lower surface of a piezoelectric layer 62 formed on the upper surface of the lower electrode 61 is equal to 25 nm or less (preferably 20 nm or less). Although the smooth upper surface of the lower electrode 61 has no crystal structure serving as nucleation site for growth of the piezoelectric layer 62 formed thereon, it forms very regular c-axis orientation in the piezoelectric layer 62 thus formed, and gives excellent piezoelectric characteristics to the piezoelectric layer 62.

Figure 9:
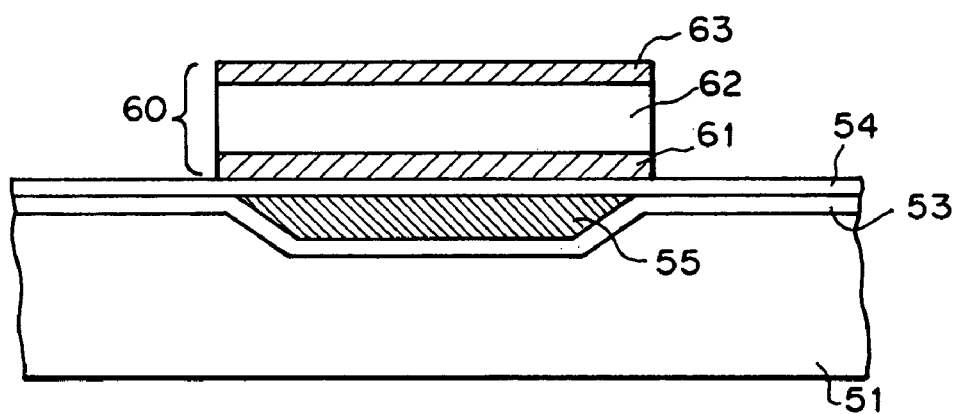
FIG. 9 is a schematic cross-sectional view showing the method of producing FBAR (thin film bulk acoustic resonator) according to the present invention, and the embodiment of FBAR thus achieved.
Figure 10:
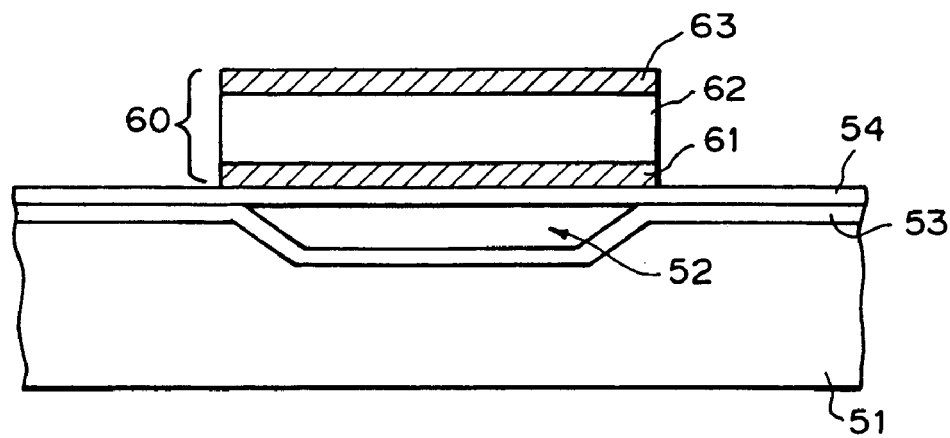
FIG. 10 is a schematic cross-sectional view showing the method of producing FBAR (thin film bulk acoustic resonator) according to the present invention, and the embodiment of FBAR thus achieved.

FIGS. 9 to 10 are schematic cross-sectional views showing another method of manufacturing FBAR which is a thin film bulk acoustic resonator according to the present invention and another embodiment of FBAR thus achieved.

In this embodiment, after the steps described with reference to FIGS. 3 to 5, an insulating layer 54 is formed as shown in FIG. 9. The insulating layer 54 is formed of, for example, $SiO_2$ film, and it may be deposited by the CVD method. In consideration of resistance to etching fluid to remove the sacrificial layer 55, $Si_3N_4$ film formed by the low-pressure CVD method is more preferably used as the insulating layer 54 than $SiO_2$ film. When $SiO_2$ film is used as the insulating layer 54, a proper protect is applied to the exposed surface of the $SiO_2$ film when the etching is carried out to remove the sacrificial layer 55.

Subsequently, the sandwich structure 60 is formed thereon by carrying out the step described with respect to FIG. 6. Subsequently, the steps described with reference to FIGS. 7 and 8 are carried out to achieve FBAR as shown in FIG. 10. At this time, in order to etch away the sacrificial layer 55, an opening having a proper size is formed at the edge portion of the sandwich structure 60 or a portion of the insulating layer 54 which is not covered by the sandwich structure 60 and located above the sacrificial layer 55, etching fluid is supplied to the sacrificial layer 55 through the opening.

In FBAR of this embodiment, the insulating layer 54 is disposed between the sandwich structure 60 and the cavity 52, and the vibrating portion is constructed to contain the insulating layer 54 as well as the sandwich structure 60, so that the strength of the vibrating portion is increased and further the frequency temperature characteristic in the vibration of the vibrating portion can be improved.

The thickness t' of the insulating layer 54 is preferably set to a value in the range from 50 to 1000 nm. This is because the ratio (t'/t) of the thickness t' of the insulating layer 54 to the thickness t of the piezoelectric layer 62 is preferably set to a value in the range from 0.1 to 0.5, and the thickness t of the piezoelectric layer 62 is preferably set to a value in the range from 500 nm to 2000 nm. The reason why the ratio t'/t is preferably set to a value in the range from 0.1 to 0.5 is as follows. That is, if t'/t is set to 0.1 or more, the effect of improving the frequency temperature characteristic in the vibration of the vibrating portion containing the insulating layer 54 would be enhanced. If t'/t is set to 0.5 or less, reduction of the electromechanical coupling coefficient and the acoustic quality factor (Q value) can be prevented. The RMS variation of the height of the upper surface of the insulating layer 54 is equal to 25 nm or less (preferably 20 nm or less).

In order to achieve a higher acoustic quality factor (Q value) in the above embodiment, the uniformity of the thickness of each of the insulating layer 54, the lower electrode 61, the piezoelectric layer 62 and the upper electrode 63 is required to be further excellent. The waviness height of the surface of the upper electrode 63 reflects the above uniformity of the thickness (that is, large waving height of the surface of the upper electrode 63 shows low thickness uniformity of at least one of the above layers, etc.). Therefore, in order to achieve a further higher acoustic quality factor (Q value), the waviness height of the surface of the upper electrode 63 is preferably set to 25% or less of the piezoelectric layer 62. From another viewpoint, the waviness height of the surface of the upper electrode 63 is preferably set to not more than 0.5% of the measurement length (when the measurement length is equal to 150 μm, the waviness height is equal to 0.75 μm or less).

The above embodiments relates to FBAR. However, it is clear that from the foregoing description persons skilled in the art can produce SBAR by using the same process. In the case of SBAR, another piezoelectric layer (second piezoelectric layer) and an upper electrode (second upper electrode) on the second piezoelectric layer must be deposited. Since the second piezoelectric layer is formed on the upper electrode of "FBAR" shown in the above embodiment, the upper electrode must be also kept to be 150 nm or less in thickness to form a surface which is so excellent that the second piezoelectric layer is deposited on the surface (i.e. the same level as the surface of the lower electrode for the first piezoelectric layer).

Figure 11:
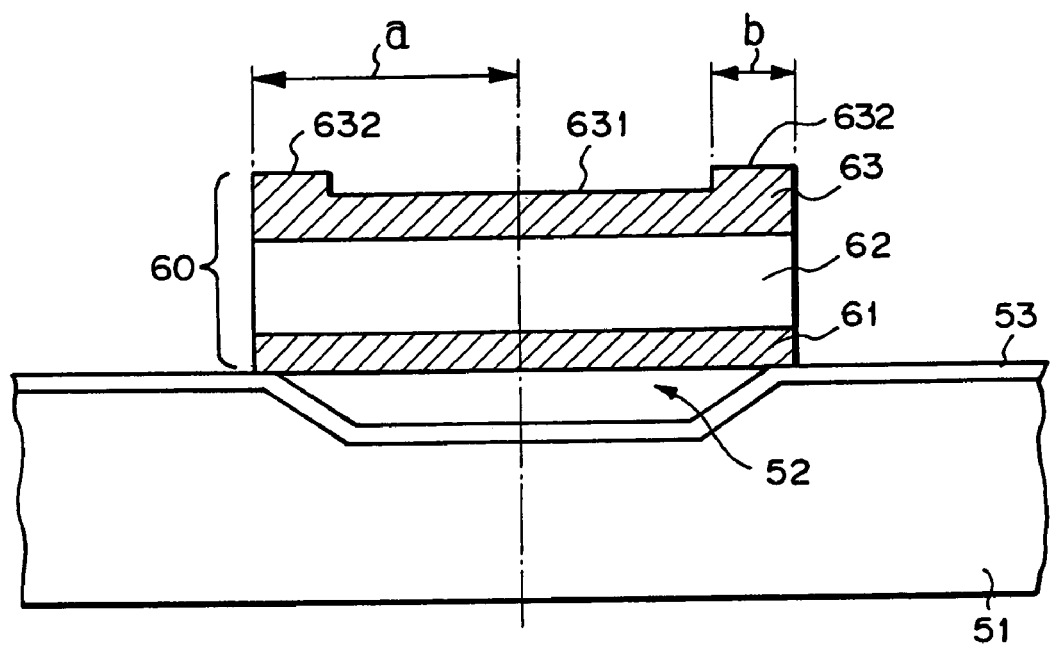
FIG. 11 is a schematic cross-sectional view showing the method of producing FBAR (thin film bulk acoustic resonator) according to the present invention, and the embodiment of FBAR thus achieved.
Figure 12:
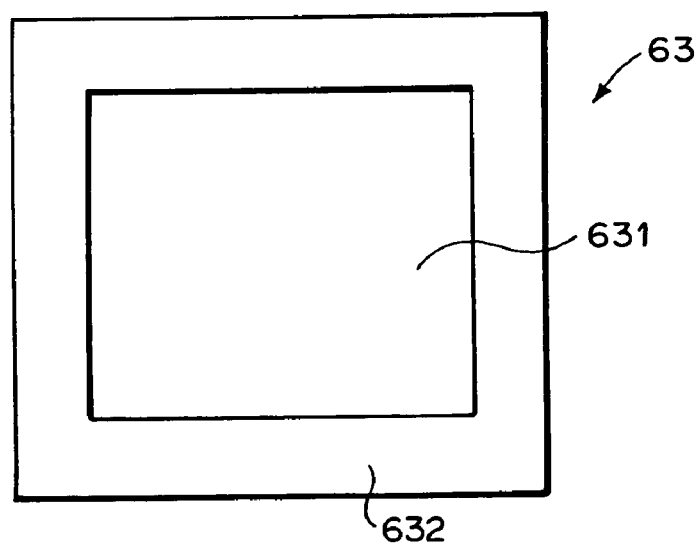
FIG. 12 is a plan view showing the method of producing FBAR (thin film bulk acoustic resonator) according to the present invention, and an upper electrode of FBAR thus achieved.

FIG. 11 is a schematic cross-sectional view showing another method of manufacturing FBAR which is a thin film bulk acoustic resonator according to the present invention and another embodiment of FBAR thus achieved, and FIG. 12 is a plan view of the upper electrode of FBAR of FIG. 11. This embodiment is different from the embodiment shown in FIGS. 3 to 8 only in the shape of the upper electrode 63.

In this embodiment, the upper electrode 63 has a center portion 631 and an outer peripheral portion 632 having a thickness larger than that of the center portion 631. The outer peripheral portion 632 is located in the form of a frame around the center portion 631. The boundary between the center portion 631 and the outer peripheral portion 632 is formed by a step.

The thickness of the outer peripheral portion 632 is preferably 1.1 time or more as large as the thickness of the center portion 631. The thickness variation of the center portion 631 is preferably set to not more than 1% of the thickness (average value) of the center portion. The size "a" of the upper electrode 63 is set to 100 μm, for example. The outer peripheral portion 632 is located within an area extending inwardly from the outer edge of the upper electrode 63 at a distance "b". The distance "b" is set to 40 μm or less, for example.

By providing the upper electrode with the above structure, occurrence of vibration in the lateral direction at the outer peripheral portion of the upper electrode can be prevented, and extra spurious vibration is prevented from being superposed on the vibration of the acoustic resonator. As a result, the resonance characteristic and the quality factor of the acoustic resonator and filter can be improved.

In this embodiment, in order to achieve a further higher acoustic quality factor (Q value), the waviness height of the surface of the center portion 631 of the upper electrode 63 is preferably set to not more than 25% of the thickness of the piezoelectric layer 62. Further, from another viewpoint, the waviness height of the surface of the center portion 631 of the upper electrode 63 is preferably set to not more than 0.5% of the measurement length.

In the above-described embodiments of the present invention, the sacrificial layer constructed by PSG is used. However, another material may be used for the sacrificial layer. For example, BPSG (Boron-Phosphor-Silicate-Glass) or another type glass such as spin glass or the like may be used. Further, plastics such as polyvinyl, polypropylene and polystyrene which can be deposited on suitable material by spinning may be used. The surfaces of these materials deposited are not smooth at the atomic level. Therefore, when the sacrificial layer is formed of each of these materials, the surface smoothening based on polishing is important as in the case of the PSG sacrificial layer. These sacrificial layers may be removed by organic removing materials or $O_2$ plasma etching.

Figure 13:
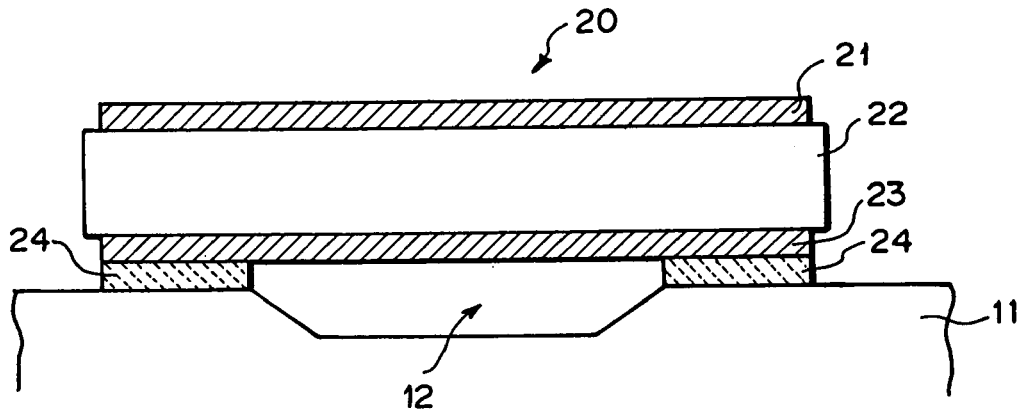
FIG. 13 is a schematic cross-sectional view showing FBAR according to the present invention.
Figure 14:
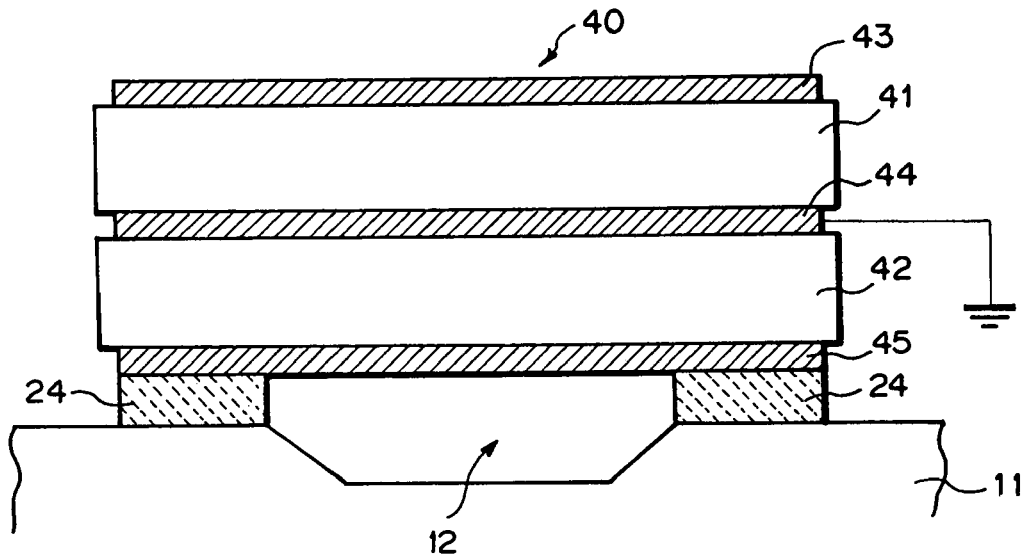
FIG. 14 is a schematic cross-sectional view showing SBAR according to the present invention.

FIGS. 13 and 14 are cross-sectional views showing FBAR and SBAR which are a thin film bulk acoustic resonator according to the present invention, respectively.

In FIG. 13, FBAR 20 comprises an upper electrode layer 21, a lower electrode layer 23 and an adhesion electrode layer or adherence electrode layer 24, and a part of a piezoelectric thin film layer 22 is sandwiched between these layers to form a sandwich structure. Aluminum nitride (AlN) or zinc oxide (ZnO) is used as preferable material for the piezoelectric thin film layer 22. The adhesion electrode layer 24 used for FBAR 20 is preferably formed of Ti, Cr, Ni or Ta, however, it may be formed of other materials. The upper and lower electrode layers 21, 23 are preferably formed of Au, Pt, W or Mo, however, other materials may be used. The sandwich structure is disposed so that the adhesion electrode layer 24 is located on the substrate 11 around the pit 12 formed on the upper surface of the substrate 11.

This device utilizes the action of bulk elastic acoustic wave in the piezoelectric thin film layer. When electrical field is generated between two electrodes 21, 23 by applying a voltage across the electrodes, the piezoelectric thin film converts a part of electrical energy to mechanical energy in the form of acoustic wave. The acoustic wave propagates in the same direction as the electric field, and is reflected at the electrode/air interface.

When mechanically resonating, the acoustic resonator play a role as an electrical resonator by the electrical energy/mechanical energy converting property of the PZ material. Accordingly, the device can operate as a notch filter. The mechanical resonance of the device occurs at the frequency at which the thickness of the material through which the acoustic wave propagates is equal to the half wavelength of the acoustic wave. The frequency of the acoustic wave is equal to the frequency of an electrical signal applied between the electrodes 21, 23. Since the velocity of sound is smaller than the velocity of light by five to six figures, the resonator thus achieved can be designed to be extremely compact. The resonators to be applied in the GHz band can be constructed in the plane size of about 100 µm order and in the thickness of several micrometers order.

Next, SBAR will be described with reference to FIG. 14. SBAR 40 gives an electrical function similar to that of a band filter. SBAR 40 basically corresponds to two mechanically-coupled FBARs. A signal traversing the adhesion electrode layer 24, the lower electrode layer 45 and the electrode layer 44 at the resonance frequency of the piezoelectric thin film layer 42 transmits the acoustic energy to the piezoelectric thin film layer 41. The mechanical vibration in the piezoelectric thin film layer 41 is converted to an electrical signal traversing the electrode layer 44 and the electrode 43.

FIGS. 15 to 21 are schematic cross-sectional views (FIGS. 15 to 20) and a schematic plan view (FIG. 21) showing a method of producing or manufacturing FBAR (thin film bulk acoustic resonator) according to the present invention and an embodiment of FBAR thus achieved.

Figure 15:
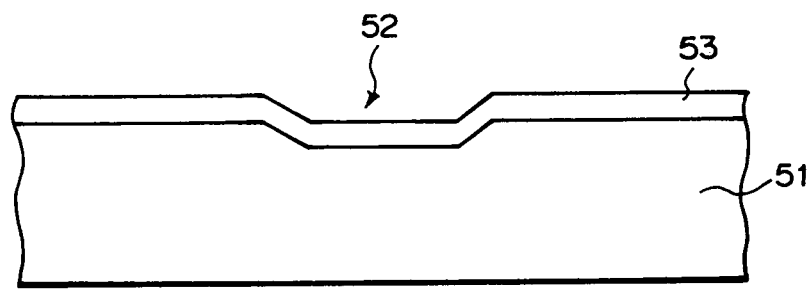
FIG. 15 is a schematic cross-sectional view showing FBAR and a method of producing FBAR according to the present invention.

First, as shown in FIG. 15, a pit or cavity or recess is formed on a normal silicon wafer 51 used for manufacturing integrated circuits by etching. The depth of the pit is preferably set to 1.5 to 30 µm, more preferably to 1.5 to 10 µm or to 3 to 30 µm as occasion demands. The depth of a cavity below the sandwich structure of FBAR is set so that the displacement generated by the piezoelectric thin film layer is permitted. Accordingly, the depth of the cavity may be set to several micrometers at maximum.

A thin layer 53 of silicon oxide is formed on the surface of the wafer 51 by thermal oxidation so that phosphorus is prevented from being diffused into the wafer 51 from the sacrificial layer of PSG which will be formed on the silicon oxide thin layer 53 in the subsequent step. In place of the silicon oxide layer, a silicon nitride layer formed by the low-pressure CVD method may be used as the thin layer 53. By suppressing the diffusion of phosphorus into the wafer 51 as described above, the silicon wafer is prevented from being converted to a conductor and the adverse effect on the electrical action of the device thus manufactured can be eliminated. The wafer 51 on which the thin layer 53 of silicon oxide or silicon nitride is formed as described above is used as the substrate. That is, FIG. 15 shows a state that a pit or cavity or recess 52 having a depth which is preferably set to 1.5 to 30 µm, more preferably to 1.5 to 10 µm or to 3 to 30 µm as occasion demands is formed on the surface of the substrate.

Figure 16:
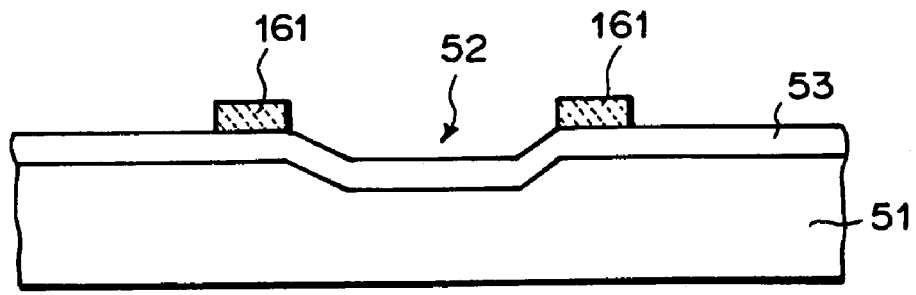
FIG. 16 is a schematic cross-sectional view showing FBAR and the method of producing FBAR according to the present invention.

Next, as shown in FIG. 16, an adhesion electrode layer or adherence electrode layer 161 is joined to and formed on the substrate so as to surround the pit 52. Representing the area (plane area) of the upper surface of the adhesion electrode layer 161 by S1 and also representing the plane area of the lower electrode formed on the adhesion electrode layer 161 by S2, it is preferable that S1 and S2 satisfies the following inequality: $0.01 \times S2 \leq S1 \leq 0.5 \times S2$. When $S1 < 0.01 \times S2$, there is a tendency that the adhesion force between the substrate and the lower electrode is weaker and a sufficient effect of the present invention cannot be achieved. Further, when $S1 > 0.5 \times S2$, the adhesion electrode layer 161 affects the action of the thin film bulk acoustic resonator, and thus there is a tendency that an excellent resonance characteristic cannot be achieved. The thickness of the adhesion electrode layer 161 may be set to such a level that it can sufficiently hold the lower electrode layer to be formed on the adhesion electrode layer 161. For example, it may be set to any value in the range from 20 nm to 1 µm. The constituent material of the adhesion electrode layer 161 may contain at least one material selected from the group consisting of Ti, Cr, Ni and Ta.

By providing the adhesion electrode layer 161 around the pit 52 of the substrate 52 as described above, occurrence of vibration in the lateral direction in the thin film bulk acoustic resonator can be suppressed, and extra spurious vibration is prevented from being superposed on the vibration of the thin film bulk acoustic resonator. As a result, the resonance characteristics and the quality factors of the thin film bulk acoustic resonator and the filter can be improved.

Further, the adhesion electrode layer 161 formed of Ti, Cr, Ni, Ta or the like does not exist at the lower side of the center portion of the lower electrode layer formed of Au, Pt, W, Mo or the like, and thus the orientation and crystallinity of the lower electrode layer can be improved at this portion. As a result, there can be achieved a piezoelectric thin film layer that has a small FWHM (Full Width at Half Maximum) of diffraction peak at a rocking curve and excellent orientation and crystalline quality. The high orientation and the excellent crystallinity of the piezoelectric thin film layer improves the resonance characteristics and the quality factors of the thin film bulk acoustic resonator and the filter according to the present invention.

Subsequently, a sacrificial layer 55 of PSG is deposited on the thin layer 53 of silicon oxide or silicon nitride of the substrate on which the adhesion electrode layer 161 is formed. As described above, PSG is deposited at a temperature of about 450° C. or less by using silane and $P_2O_5$ source as raw materials as described above to thereby form a soft-glass-like material containing about 8% phosphorus. As examples of silane may be used monosilane ($SiH_4$), trichlorosilane ($SiHCl_3$), silicon tetramethoxide ($Si(OCH_3)_4$), silicon tetraethoxide ($Si(OC_2H_5)_4$), etc. As examples of the $P_2O_5$ source may be used not only $P_2O_5$, but also phosphine ($PH_3$), trimethyl phosphite ($P(OCH_3)_3$), triethyl phosphite ($P(OC_2H_5)_3$), trimethyl phosphate ($PO(OCH_3)_3$), triethyl phosphate ($PO(OC_2H_5)_3$), etc. This low-temperature process is well known to persons skilled in the art.

PSG is a very clean inactive material which can be deposited at a relatively low temperature and etched at a very high etching rate with dilute $H_2O$:HF solution, and thus it is preferably used as the material of the sacrificial layer. In the etching step executed in the subsequent step, the etching rate of about 3 µm per minute in the dilute ratio of 10:1 is achieved.

The surface of the PSG sacrificial layer 55 would be very rough at the atomic level if it is left as it is. Accordingly, the PSG sacrificial layer 55 as deposited is insufficient as a base body to form the thin film bulk acoustic resonator. The FBAR/SBAR type thin film bulk acoustic resonator needs a piezoelectric material whose crystal is grown as prismatic or columnar crystal vertical to the plane of the electrode. By polishing and smoothening the surface of the PSG sacrificial layer 55 with polishing slurry containing fine polishing particles, the lower electrode layer having excellent orientation and crystal quality can be formed, and thus the piezoelectric thin film having excellent orientation and crystal quality can be formed.

Figure 18:
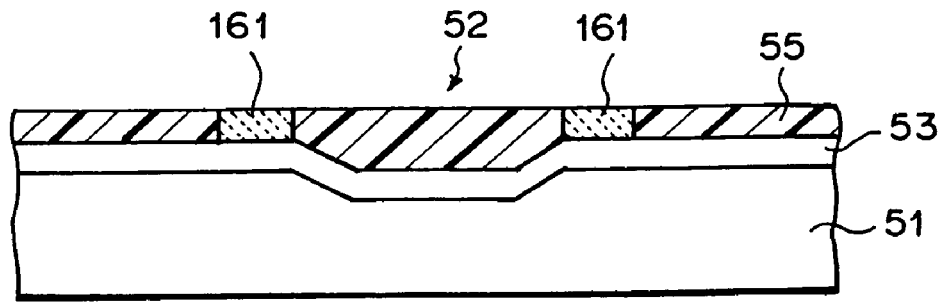
FIG. 18 is a schematic cross-sectional view showing FBAR and the method of producing FBAR according to the present invention.

That is, as shown in FIG. 18, the surface of the PSG sacrificial layer 55 is polished with roughly finishing slurry to be flattened or planarized, and a portion of the PSG layer deposited on the adhesion electrode layer 161 is removed. Subsequently, the remaining PSG layer 55 may be further polished by using precisely finishing slurry containing finer polishing particles. As a substitute method, one finer precisely finishing slurry may be used in the two polishing steps if further polishing time is permitted. The target is to implement finishing like "mirror" (mirror-like finishing).

In the present invention, before the PSG layer is polished, it is preferable to subject the PSG layer to heat treatment at high temperature for the purpose of densification and reflow. The heat treatment of the PSG layer may be performed by RTA (Rapid Thermal Anneal) method. This is carried out at a temperature range from 750° C. to 950° C. under nitrogen atmosphere or nitrogen-oxygen mixture atmosphere. Alternatively, the high-temperature heat treatment may be carried out in a diffusion furnace or by lamp heating. In the present invention, by subjecting the PSG layer to the high-temperature heat treatment, the PSG layer can be designed to have a more densified structure and the hardness thereof is increased. By increasing the hardness of the PSG layer, polishing damage such as scratch or the like is prevented from occurring on the surface of the PSG film in the subsequent CMP (Chemical Mechanical Polishing), and the surface of the PSG film can be excellently flattened.

It is important to clean the substrate after the polishing as described above. The slurry causes a slight amount of silica coarse grain to remain on the substrate. Accordingly, the coarse grain must be removed. In a preferred embodiment of the present invention, the removal of the coarse grain is carried out by using a second polishing tool having a rigid pad such as Polytex (trademark) produced by Rodel Nitta Incorporated Company. In this case, deionized water is used as lubricant, and the wafer is immersed in the deionized water from the time when the substrate has been polished until the time when the standby of the final cleaning step is completed. It should be noted that the substrate is prevented from being dried from the last polishing step to the final cleaning step. The final cleaning step comprises a step of immersing the substrate into a series of tanks which are charged with various chemicals. Ultrasonic stirring is applied to each tank. Such cleaning means is known to persons skilled in the art.

The polishing material is formed of silica fine particles. In the preferred embodiment of the present invention, ammonia-based slurry of silica fine particle (Rodel Klebosol#30N: Rodel Nitta Incorporated Company) is used as the polishing material.

In the foregoing description, the specific polishing and cleaning manners are described. However, any polishing and cleaning manners may be used insofar as they can give required smooth surface. In the preferred embodiment of the present invention, with respect to the finished surface, the RMS variation of the height of the surface which is measured by an atomic force microscope probe is equal to 25 nm or less, preferably 20 nm or less, and more preferably 10 nm or less in surface roughness.

Figure 19:
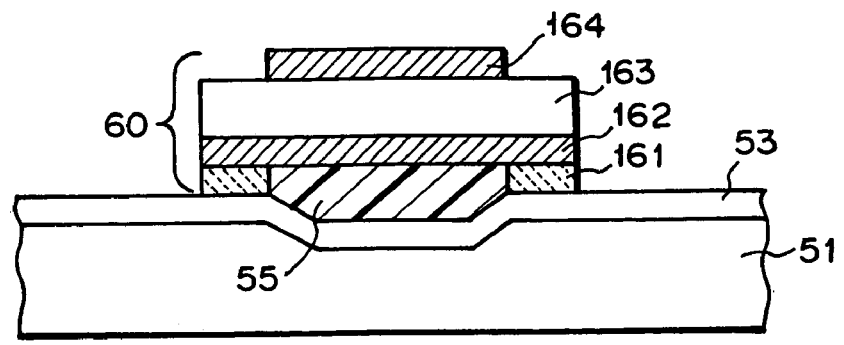
FIG. 19 is a schematic cross-sectional view showing FBAR and the method of producing FBAR according to the present invention.

After the surface is smoothened and further the surface of the adhesion electrode layer 161 is cleaned by plasma etching, the lower electrode layer 162 of the sandwich structure 60 is deposited as shown in FIG. 19. Au, Pt, W or Mo is preferably used as the material of the lower electrode layer 162. The orientation and crystal quality of the piezoelectric thin film layer 163 formed on the lower electrode layer 162 reflect the orientation and crystallinity of the lower electrode layer 162.

The thickness of the lower electrode layer 162 is important. The thick layer has rougher surface than the thin layer. It is very important for the performance of the resonator achieved that the smooth surface is kept for deposition of the piezoelectric thin film layer as described above. Accordingly, the thickness of the lower electrode layer 162 is preferably less than 200 nm. Au, Pt, W or Mo is preferably deposited by sputtering. According to this method, there is achieved the lower electrode layer 162 having the RMS variation of the height of the surface that is equal to 25 nm or less, preferably 20 nm or less, more preferably 10 nm or less in surface roughness.

After the deposition of the lower electrode layer 162 is finished, the PSG sacrificial layer remaining around the lower electrode layer 162 is removed, and the piezoelectric thin film layer 163 is deposited. AlN or ZnO is preferably used as the material of the piezoelectric thin film layer 163, and it is deposited by sputtering. In the preferred embodiment of the present invention, the thickness of the piezoelectric thin film layer 163 is set to a value in the range from 0.1 µm to 10 µm, preferably to a value in the range from 0.5 µm to 2 µm.

Finally, the upper electrode layer 164 is deposited. The upper electrode layer 164 is formed of the same material as the lower electrode layer 162, and Au, Pt, W or Mo is preferably used.

Figure 20:
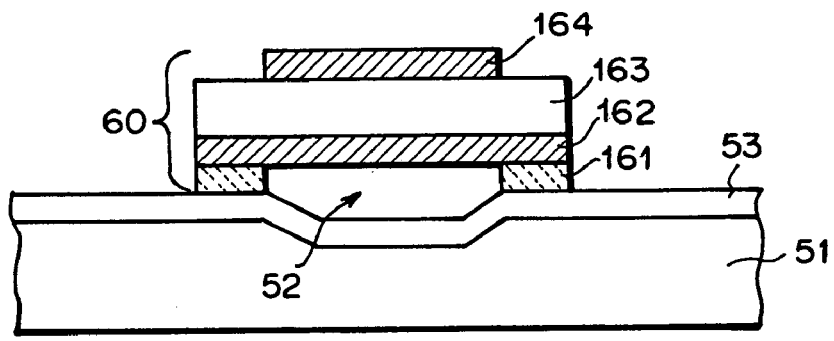
FIG. 20 is a schematic cross-sectional view showing FBAR and the method of producing FBAR according to the present invention.
Figure 21:
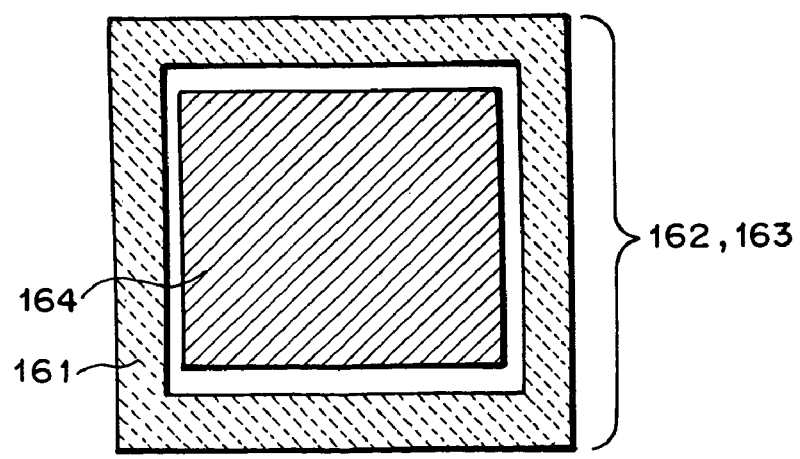
FIG. 21 is a schematic plan view showing FBAR and the method of producing FBAR according to the present invention.

After the sandwich structure 60 which comprises the joined structure of the adhesion electrode layer 161, the lower electrode layer 162, the piezoelectric thin film layer 163 and the upper electrode layer 164 and is patterned to have a desired shape is formed as described above, a small through hole extending downwardly from the peripheral portion of the upper electrode layer 164 through the upper electrode layer 164, the piezoelectric thin film layer 163 and the lower electrode layer 162 to the sacrificial layer 55 is formed by a dry etching method such as RIE (reactive ion etching) or the like, and then etching using dilute $H_2O$:HF solution is carried out to remove PSG below the sandwich structure 60, whereby the bridged sandwich structure 60 remains on the recess 52 as shown in FIGS. 20 and 21. That is, the sandwich structure 60 is disposed so that the adhesion electrode layer 161 is located around the pit 52 formed on the surface of the substrate and the edge portion of the sandwich structure 60 is supported on the substrate so as to stride over the pit 52.

In the thin film bulk acoustic resonator thus achieved, the weight is increased at the peripheral portion of the sandwich structure 60 by the amount corresponding to the adhesion electrode layer 161, so that occurrence of vibration in the lateral direction can be suppressed and extra spurious vibration can be prevented from being superposed on the vibration in the thin film bulk acoustic resonator. The formation of the adhesion electrode layer 161 around the pit 52 makes it possible to deposit the lower electrode layer of Au, Pt or the like which has not been hitherto able to solely deposit on the cavity, and the adhesion between the lower electrode layer of W, Mo or the like and the base substrate can be improved.

According to the manufacturing method of the thin film bulk acoustic resonator as described above, the center portion of the lower electrode layer 162 of Au, Pt, W, Mo or the like is formed on glassy sacrificial layer such as silica glass, phospho-silicate glass-or the like, and thus the orientation and crystallinity of the lower electrode layer is more excellent than the conventional case where the electrode layer of Au, Pt W, Mo or the like is wholly formed on the adhesion layer of Ti or the like, so that excellent crystal film having a small full width at half maximum (FWHM) of diffraction peak in the rocking curve can be achieved. By improving the orientation and crystal quality of the lower electrode layer 162 as described above, the orientation and crystal quality of the piezoelectric thin film layer formed on the lower electrode layer 162 can be improved.

The above-described embodiment relates to FBAR. However, it is clear that persons skilled in the art can manufacture SBAR by using the same process from the foregoing description. In the case of SBAR, another piezoelectric layer (second piezoelectric layer) and an electrode layer on the piezoelectric layer must be deposited. The second piezoelectric layer is formed on the upper electrode layer of "FBAR" shown in the above-described embodiment. Therefore, the thickness of the upper electrode layer is kept to, for example, 100 nm so that such a proper surface state that the second piezoelectric layer can be deposited on the surface can be given. For example, it is preferable that the surface is smoothened so that the RMS variation of the height thereof is equal to 25 nm or less, preferably to 20 nm or less and more preferably to 10 nm or less in surface roughness.

In the above-described embodiment of the present invention, the sacrificial layer formed of PSG is used, however, other materials may be used for the sacrificial layer. For example, BPSG (Boron-Phosphor-silicate-Glass) or other type glass like spin glass may be used. Besides, plastics such as polyvinyl, polypropylene, polystyrene, etc. which can be deposited on the substrate by spinning may be used. When the sacrificial layer is formed of each of these materials, it is important to smoothen the surface by polishing. as in the case of the PSG sacrificial layer. These sacrificial layers may be removed by organic removing agent or $O_2$ plasma etching.

Figure 22:
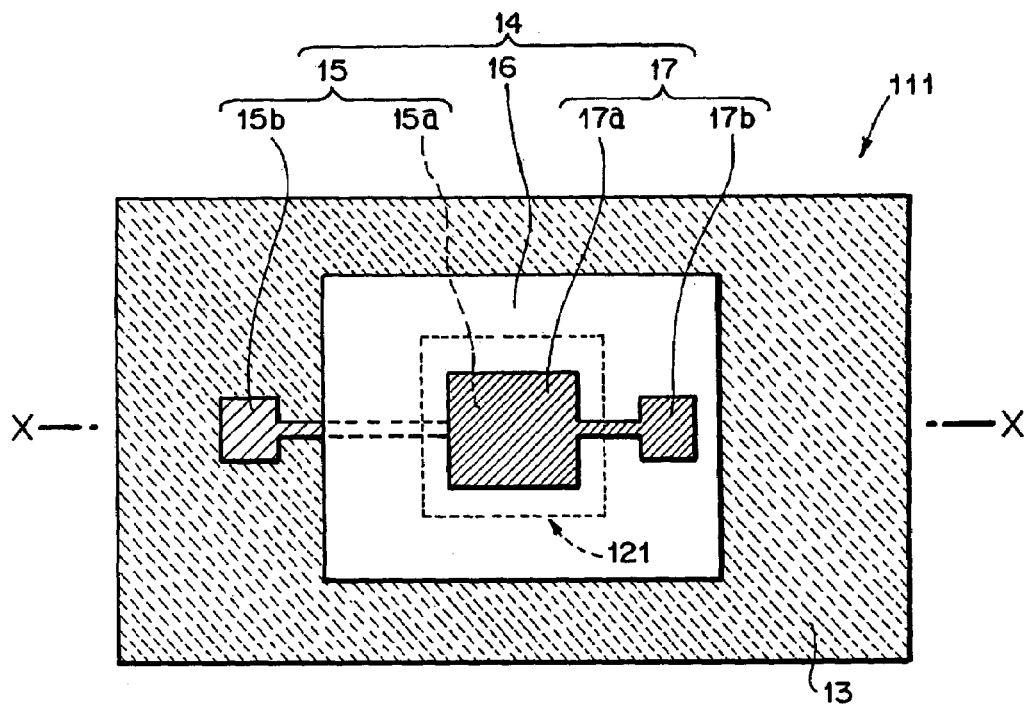
FIG. 22 is a schematic plan view showing an embodiment of a thin film bulk acoustic resonator according to the present invention.
Figure 23:
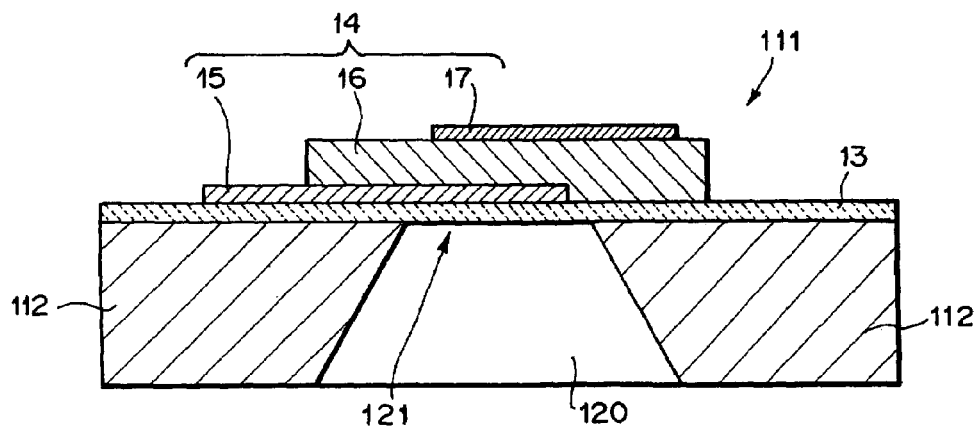
FIG. 23 is a cross-sectional view taken along X—X of FIG. 22.

Next, FIG. 22 is a schematic plan view showing an embodiment of the piezoelectric thin film resonator (thin film bulk acoustic resonator) according to the present invention, and FIG. 23 is a cross-sectional view taken along X—X of FIG. 22. In FIGS. 22 and 23, a piezoelectric thin film resonator 111 has a substrate 112, an insulating layer 13 formed on the upper surface of the substrate 112, and a piezoelectric stack structure 14 joined onto the upper surface of the insulating layer 13.

The piezoelectric stack structure 14 comprises a lower electrode 15 formed on the upper surface of the insulating layer 13, a piezoelectric film 16 formed on the upper surface of the base film 13 so as to cover a part of the lower electrode 15 and an upper electrode 17 formed on the upper surface of the piezoelectric film 16. A via hole 120 forming a cavity is formed in the substrate 112. A part of the insulating layer 13 is exposed to the via hole 120. The exposed portion of the insulating layer 13 and the portion of the piezoelectric stack structure 14 which corresponds to the exposed portion concerned constitute a vibrating portion (vibrating diaphragm) 121. The lower electrode 15 and the upper electrode 17 have main body portions 15a, 17a formed in the area corresponding to the vibrating portion 121 and terminal portions 15b, 17b for connecting the main body portions 15a, 17a to an external circuit. The terminal portions 15b, 17b are located out of the area corresponding to the vibrating portion 121.

As the substrate 112 may be used single crystal such as Si(100) single crystal or the like, or base material such as Si single crystal or the like on which polycrystalline film of silicon, diamond or the like is formed. An anisotropic etching method of starting anisotropic etching from the lower surface side of the substrate may be used as the method of forming the via hole 120 of the substrate 112. The forming source for the cavity to be formed in the substrate 112 is not limited to the via hole 120, and any source may be used insofar as it permits vibration of the vibrating portion 121. For example, a pit portion or cavity portion or recess portion formed in an area of the upper surface of the substrate which corresponds to the vibrating portion 121 may be used.

The insulating layer 13 is formed of dielectric film mainly comprising silicon oxide ($SiO_2$) or silicon nitride ($SiN_x$) (preferably the content thereof is equal to 50 equivalent % or more). The dielectric film may comprise a monolayer or plural layers containing a layer for increasing adhesion force, etc. As an example of the dielectric film comprising plural layers, a silicon nitride layer added onto one surface or both the surfaces of an $SiO_2$ layer may be used. The thickness of the insulating layer 13 is equal to 0.2 to 2.0 μm, for example. As the method of forming the insulating layer 13 may be used the thermal oxidation method of the surface of the substrate 112 of silicon, the CVD method or the low-pressure CVD method.

Each of the lower electrode 15 and the upper electrode 17 comprises a conductive film mainly formed of molybdenum (Mo) (preferably, the content thereof is 80 atomic % or more). Since Mo has a low thermoelastic loss (about 1/56 of Al), it is preferably used particularly to construct a vibrating portion vibrating at high frequencies. Not only Mo is used alone, but also alloy mainly containing Mo may be used. The thickness of each of the lower electrode 15 and the upper electrode 17 is equal to 50 to 200 nm, for example. A sputtering method or deposition method may be used to form the lower electrode 15 and the upper electrode 17. As occasion demands, a photolithography technique is used for patterning to achieve a desired shape.

The piezoelectric film 16 comprises a piezoelectric film mainly formed of AlN (preferably, the content thereof is 90 equivalent % or more), and the thickness thereof is equal to 0.5 to 2.5 μm, for example. A reactive sputtering method may be used to form the piezoelectric film 16, and as occasion demands, the photolithography technique is used for patterning to achieve a desired shape.

With respect to FBAR that has the piezoelectric film 16 having the construction shown in FIGS. 22 and 23 and mainly formed of AlN and also having a fundamental mode in the neighborhood of 2 GHz, the inventors have dedicated to improving the temperature stability of the resonance frequency for FBAR without degrading the electromechanical coupling coefficient and the acoustic quality factor while taking advantage of the feature of the AlN thin film that the propagation velocity of elastic wave is high, and as a result they have discovered that it is effective to use an insulating layer 13 mainly formed of $SiO_2$ or $SiN_x$ and also use upper and lower electrodes 15, 17 mainly formed of Mo. Further, they have discovered that all of the electromechanical coupling coefficient, the acoustic quality factor and the temperature stability of the resonance frequency are furthermore greatly improved by satisfying the following inequality: $0.1 \leq t'/t \leq 0.5$, preferably $0.2 \leq t'/t \leq 0.4$, wherein t represents the thickness of the piezoelectric film 16 and t' represents the thickness of the insulating layer 13. If $t'/t<0.1$, the electromechanical coupling coefficient and the acoustic quality factor may be slightly increased in some cases, however, there is a tendency that the absolute value of the temperature coefficient of the resonance frequency is increased and the characteristic as FBAR is lowered. On the other hand, if $t'/t>0.5$, there is a tendency that the electromechanical coupling coefficient and the acoustic quality factor are lowered and the absolute value of the temperature coefficient of the resonance frequency is increased, so that the characteristic as FBAR is lowered.

Figure 24:
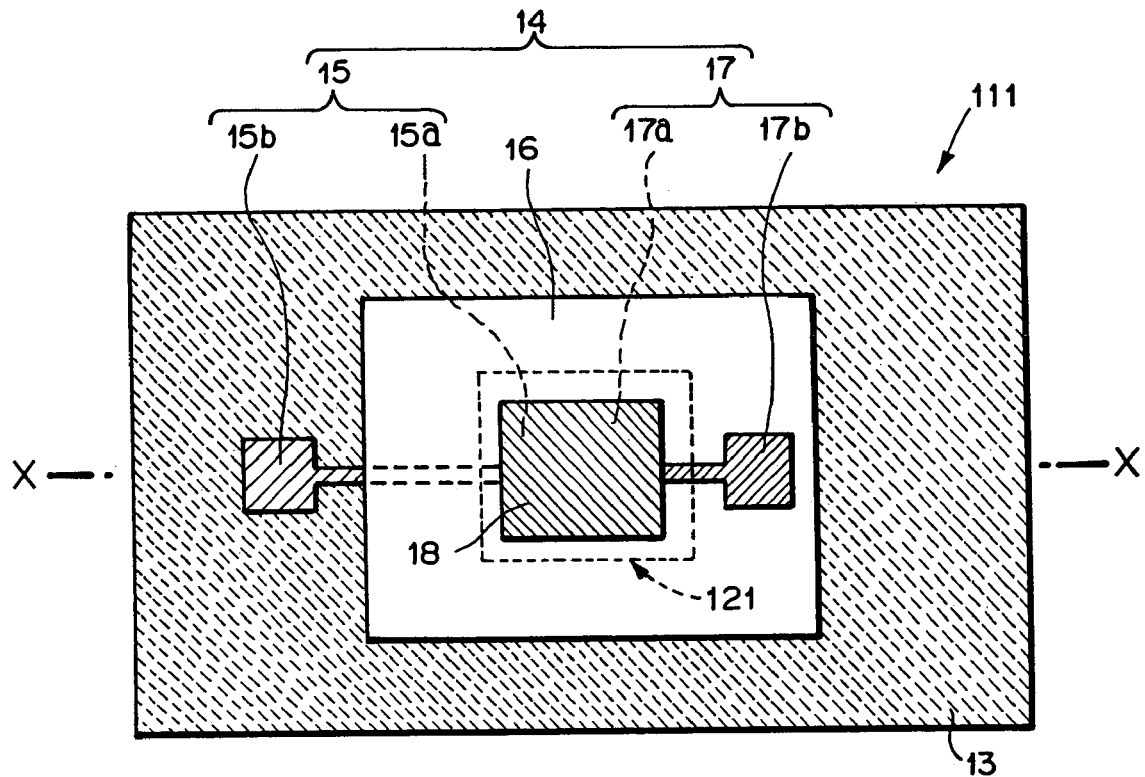
FIG. 24 is a schematic plan view showing an embodiment of a thin film bulk acoustic resonator according to the present invention.
Figure 25:
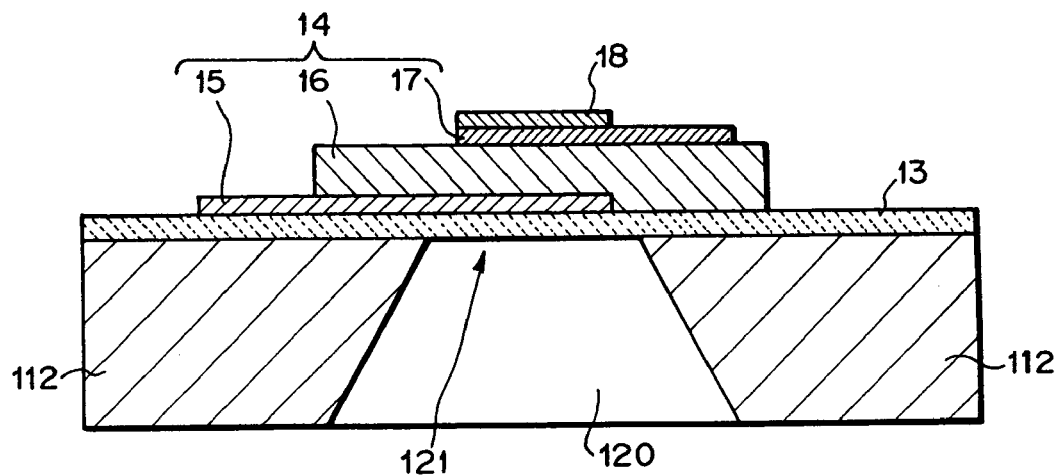
FIG. 25 is a cross-sectional view taken along X—X of FIG. 24.

FIG. 24 is a schematic plan view showing another embodiment of the piezoelectric thin film resonator according to the present invention, and FIG. 25 is a cross-sectional view taken along X—X of FIG. 24. In FIGS. 24 and 25, the elements having the same functions as those of FIGS. 22 and 23 are represented by the same reference numerals.

In this embodiment, in addition to the insulating layer 13, an insulating layer 18 mainly formed of $SiO_2$ or $SiN_x$ (preferably the content thereof is equal to 50 equivalent % or more) is joined to the piezoelectric stack structure 14. The insulating layer 18 is formed on the main body portion 17a of the upper electrode 17. The insulating layer 18 may be formed in a broad area on the piezoelectric film 16 so as to extend further outwardly from the area corresponding to the vibrating portion 121. Further, when the insulating layer 18 mainly formed of silicon oxide or silicon nitride is formed, the insulating layer 13 may be omitted. However, in this case, it is preferable that the main body portion 15a of the lower electrode 15 extends through two sides of a rectangular opening of the via hole 120 at the upper surface of the substrate 112 to the inside of the opening so that the vibrating portion 121 is held by the lower electrode 15.

The embodiment shown in FIGS. 24 and 25 has the same effect as that of FIGS. 22 and 23.

Figure 26:
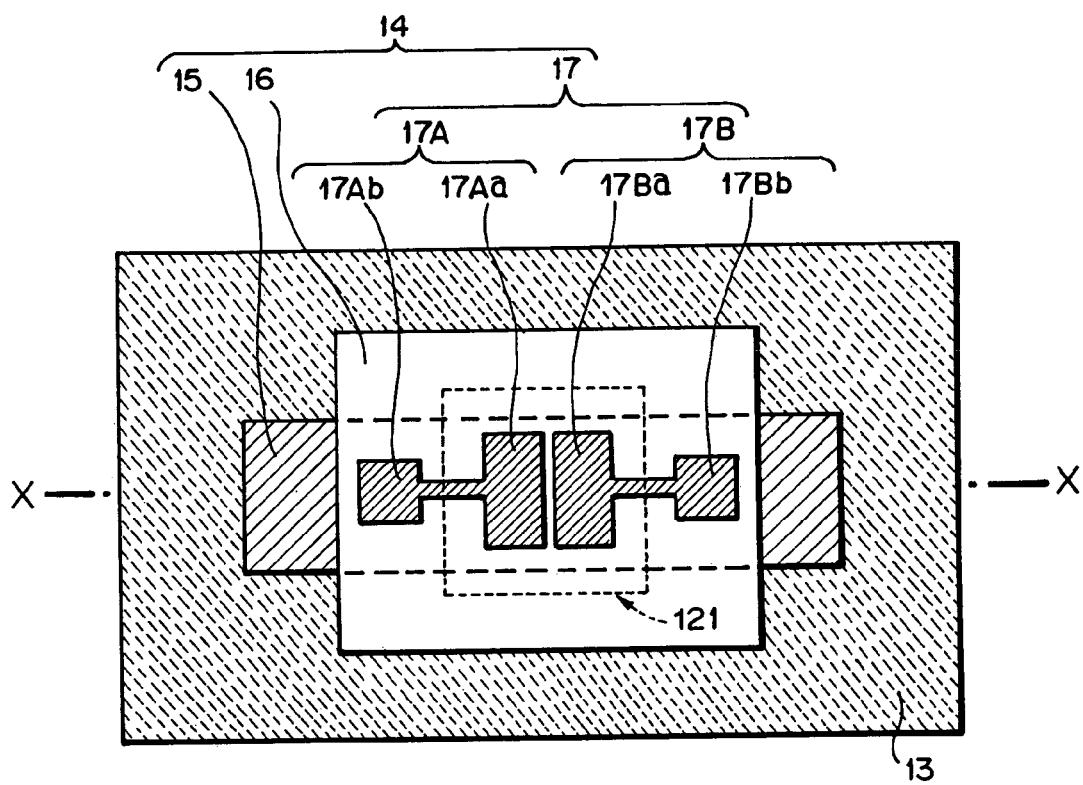
FIG. 26 is a schematic plan view showing an embodiment of a thin film bulk acoustic resonator according to the present invention.
Figure 27:
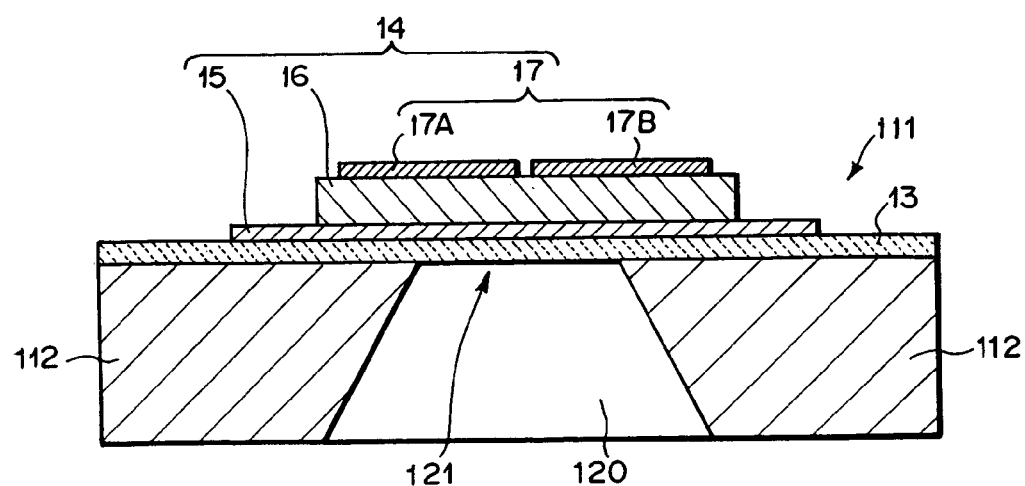
FIG. 27 is a cross-sectional view taken along X—X of FIG. 26.

FIG. 26 is a schematic plan view showing another embodiment of the piezoelectric thin film resonator according to the present invention, and FIG. 27 is a cross-sectional view taken along X—X of FIG. 26. In FIGS. 26 and 27, the same elements having the same function as those of FIGS. 22 to 25 are represented by the same references.

In this embodiment, the lower electrode 15 has a rectangular shape, and the upper electrode 17 comprises a first electrode portion 17A and a second electrode portion 17B. The electrode portions 17A, 17B have main body portions 17Aa, 17Ba and terminal portions 17Ab, 17Bb, respectively. Each of the main body portions 17Aa, 17Ba is located in the area corresponding to the vibrating portion 121, and each of the terminal portions 17Ab, 17Bb is located out of the area corresponding to the vibrating portion 121.

Figure 28:
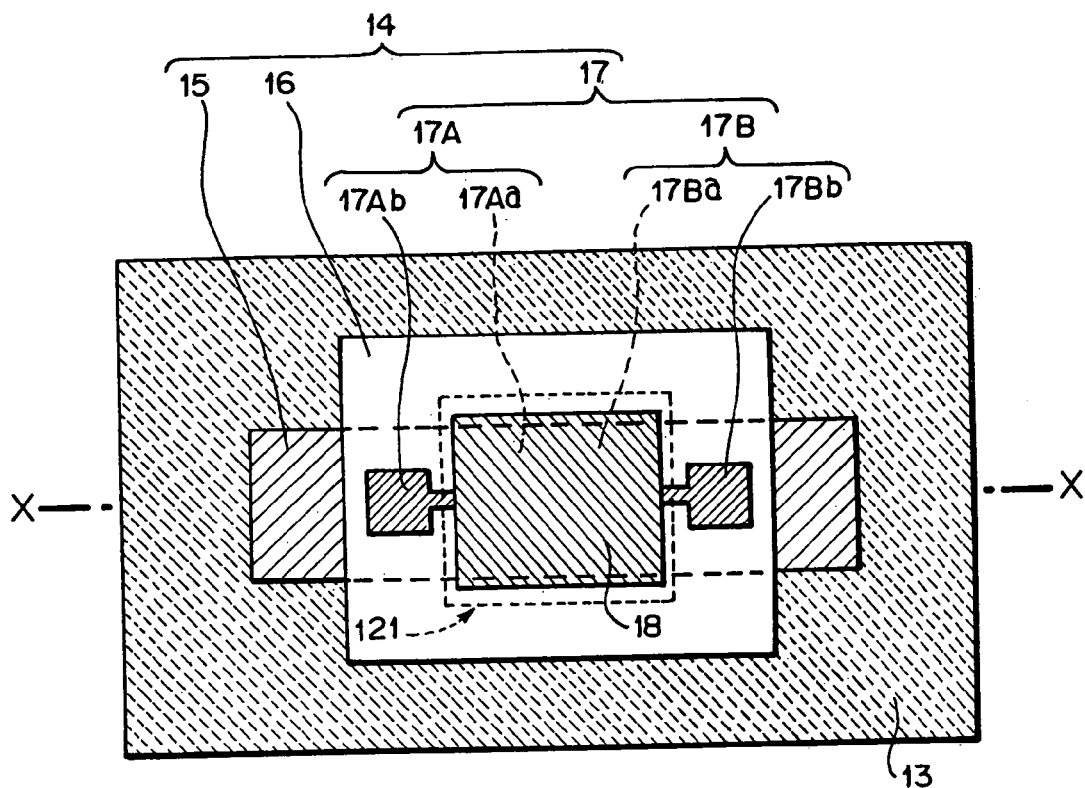
FIG. 28 is a schematic plan view showing an embodiment of a thin film bulk acoustic resonator according to the present invention.
Figure 29:
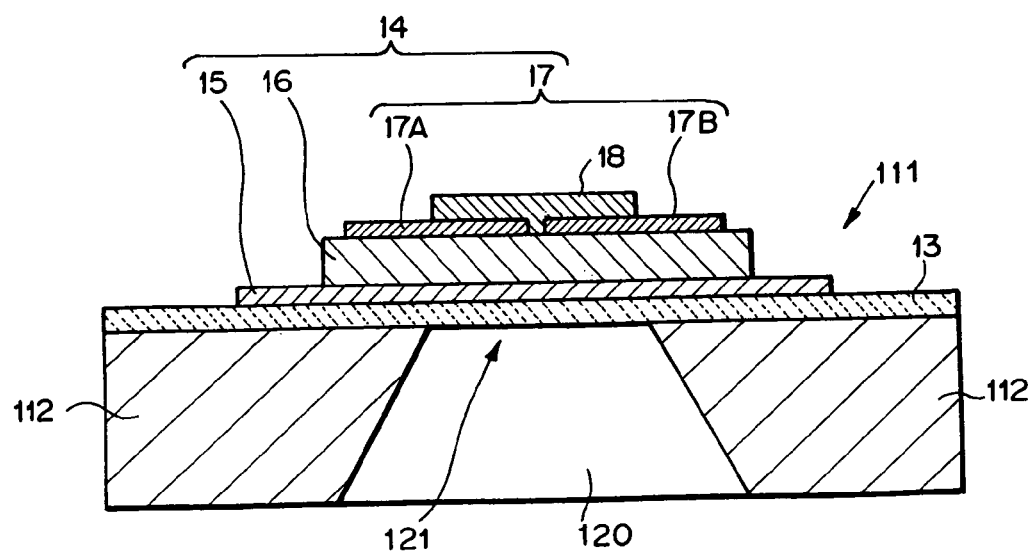
FIG. 29 is a cross-sectional view taken along X—X of FIG. 28.

FIG. 28 is a schematic plan view showing another embodiment of the piezoelectric thin film resonator according to the present invention, and FIG. 29 is a cross-sectional view taken along X—X of FIG. 28. In FIGS. 28 and 29, the elements having the same functions as those of FIGS. 22 to 27 are represented by the same reference numerals.

In this embodiment, the lower electrode 15 has a rectangular shape, and the upper electrode 17 comprises a first electrode portion 17A and a second electrode portion 17B. These electrode portions 17A, 17B have main body portions 17Aa, 17Ba and terminal portions 17Ab, 17Bb, respectively. Each of the main body portions 17Aa, 17Ba is located in the area corresponding to the vibrating portion 121, and each of the terminal portions 17Ab, 17Bb is located out of the area corresponding to the vibrating portion 121. In this embodiment, the insulating layer 18 is formed so as to cover both the main body portion 17Aa of the first electrode portion and the main body portion 17Ba of the second electrode portion.

The embodiment shown in FIGS. 26, 27 and the embodiment of FIGS. 28, 29 have the same effect as the embodiment of FIGS. 22, 23 and the embodiment of FIGS. 24, 25. The embodiments shown in FIGS. 26, 27 and FIGS. 28, 29 relate to a so-called multiple-mode resonator. An input voltage is applied between one of the upper electrodes 17 (for example, the second electrode portion 17B) and the lower electrode 15, and the voltage between the other of the upper electrodes 17 (for example, the first electrode portion 17A) and the lower electrode 15 can be taken out as an output voltage.

In the piezoelectric thin film resonator as described above, the following relationship (equations) is satisfied among the electromechanical coupling coefficient $k_t^2$ and the resonant frequency $f_r$ and antiresonant frequency $f_a$ in the impedance characteristic measured by using a microwave prober:

$$k_t^2 = \phi_r / \tan(\phi_r)$$

$$\phi_r = (\pi/2)(f_r/f_a)$$

For the purpose of simple description, the electromechanical coupling coefficient $k_t^2$ may be calculated by using the following equation:

$$k_t^2 = 4.8(f_a - f_r)/(f_a + f_r)$$

In this specification, values of the electromechanical coupling coefficient $k_t^2$ calculated by the above equation are used.

FBARs having the constructions shown in FIGS. 22 to 29, the electromechanical coupling coefficients obtained from the measurement values of the resonant frequency and the antiresonant frequency in the neighborhood of 2.0 GHz are equal to 4.0 to 6.5%. If the electromechanical coupling coefficient $k_t^2$ is less than 4.0%, there would be a tendency that the band width of FBAR manufactured is reduced and thus it is difficult to practically use FBAR in a high-frequency band area.

The present invention will be described in more detail by the following Examples.

EXAMPLE 1

A thin film bulk acoustic resonator was manufactured in the manner as shown in FIGS. 3 to 8.

First, the surface of a Si wafer 51 was coated with a Pt/Ti protection film, and the protection film was etched to have a predetermined pattern for formation of a pit or cavity or recess, thereby forming a mask for etching the Si wafer 51. Thereafter, wet etching was carried out by using the Pt/Ti pattern mask thus formed to form a pit or cavity or recess of 20 μm in depth and 150 μm in width. The etching was carried out with KOH water solution of 5% by weight at a liquid temperature of 70° C. Alternatively, the depth of the pit may be set to 3 μm.

Thereafter, the Pt/Ti pattern mask was removed, and a $SiO_2$ layer 53 of 1 μm in thickness was formed on the surface of the Si wafer 51 by thermal oxidation, thereby achieving such a structure that the pit 52 is formed in the substrate comprising the Si wafer 51 and the $SiO_2$ layer 53.

Subsequently, as shown in FIG. 4, a PSG sacrificial layer 55 of 30 μm in thickness was deposited on the $SiO_2$ layer having the pit 52 formed thereon. This deposition was carried out at 450° C. by the thermal CVD method using silane and $P_2O_5$ as raw materials. Alternatively, the thickness of the PSG sacrificial layer 55 may be set to 5 μm, and silane and trimethyl phosphate ($PO(OCH_3)_3$) may be used as raw materials in the thermal CVD method. Further, the PSG sacrificial layer deposited may be subjected to a heat treatment at 850° C. for 20 minutes under the 1% oxygen/nitrogen mixture atmosphere and reflowed to increase the hardness of the PSG sacrificial layer.

Subsequently, as shown in FIG. 5, the surface of the PSG sacrificial layer 55 was polished to remove the PSG sacrificial layer 55 in the area out of the pit 52. Subsequently, the surface of the PSG sacrificial layer 55 remaining in the pit 52 was polished with slurry containing fine polishing particles to set the RMS variation of the height of the surface to 10 nm.

Subsequently, as shown in FIG. 6, a lower electrode 61 comprising a Mo film of 100 nm in thickness and 200×200 μm in size was formed on the PSG sacrificial layer 55. The formation of the Mo film was carried out at room temperature by a DC magnetron sputtering method using Ar as sputter gas. The Mo film was subjected to a patterning treatment by a lift-off method. The surface roughness of the Mo film thus formed was measured, and the result indicated that the RMS variation of the height was equal to 15 nm.

Subsequently, a piezoelectric layer 62 comprising a ZnO film of 1.0 μm in thickness was formed on the lower electrode 61. The formation of the ZnO film was carried out by using the RF magnetron sputtering method under the condition that ZnO was used as sputtering target, mixture gas of Ar and $O_2$ was used as sputter gas, the sputter gas pressure was set to 5 mTorr and the substrate temperature was set to 400° C. The surface roughness of the ZnO film thus formed was measured, and the result indicated that the RMS variation of the height was equal to 11 nm, which was not more than 5% of the film thickness. The ZnO film was patterned into a predetermined shape by wet etching to achieve the piezoelectric layer 62.

Subsequently, an upper electrode comprising a Mo film of 100 nm in thickness was formed on the piezoelectric layer 62. The formation and patterning of the Mo film were carried out in the same manner as the formation of the lower electrode 61. With respect to the surface of the upper electrode 63, the waviness height was measured at the measurement length of 150 μm, and the result was equal to 0.2 μm which was not more than 25% of the thickness of the piezoelectric layer 62 and also not more than 0.5% of the measurement length.

Subsequently, the PSG sacrificial layer 55 was removed by the etching using dilute $H_2O$:HF solution, thereby forming such a structure that the sandwich structure 60 of Mo/ZnO/Mo was suspended over the pit 52 as shown in FIG. 8.

Thin film XRD analysis was conducted on the piezoelectric layer 62 thus achieved. The result was that the c-axis of the film was inclined at an angle of 88.5 degrees with respect to the film surface. Further, the orientation was examined on the basis of the rocking curve, and the result was that the full width at half maximum of the peak was equal to 2.5 degrees and excellent orientation was exhibited.

With respect to the acoustic resonator thus achieved, the impedance characteristic between the upper electrode 63 and the lower electrode 61 was measured by using a microwave prober, the resonant frequency $f_r$ and the antiresonant frequency $f_a$ were measured, and then the electromechanical coupling coefficient $k_t^2$ was calculated on the basis of these measurement values. The electromechanical coupling coefficient $k_t^2$ was equal to 5.5%, and the acoustic quality factor was equal to 700. The construction of FBAR achieved in EXAMPLE 1 and the characteristics thereof as the acoustic resonator are shown in Table 1.

COMPARATIVE EXAMPLE 1

An acoustic resonator was manufactured-in the same manner as EXAMPLE 1 except that the surface of the PSG sacrificial layer 55 was polished so that the RMS variation of the height thereof (surface roughness) was equal to 70 nm.

The surface roughness of the Mo film of the lower electrode 61 was measured, and the result was that the RMS variation of the height was equal to 80 nm. Further, the surface roughness of the ZnO film was measured, and the result was that the RMS variation of the height was equal to 75 nm (exceeding 5% of the film thickness). With respect to the surface of the upper electrode 63, the waviness height at the measurement length of 150 μm was measured, and the result was that it was equal to 1.0 μm (exceeding 0.5% of the measurement length).

Further, the thin film XRD analysis was conducted on the piezoelectric layer 62 thus achieved, so that the c-axis of the film was greatly inclined at an angle of 85.0 degrees with respect to the film surface. The orientation was examined on the basis of the rocking curve, so that the full width at half maximum of the peak was equal to 7.0 degrees.

The electromechanical coupling coefficient $k_t^2$ of the acoustic resonator thus achieved was equal to 3.0%, and the acoustic quality factor thereof was equal to 400. The construction of FBAR achieved in COMPARATIVE EXAMPLE 1 and the characteristics thereof as the acoustic resonator are shown in Table 1.

EXAMPLE 2

An acoustic resonator was manufactured in the same manner as EXAMPLE 1 except that AlN film was used as the piezoelectric film 62 in place of the ZnO film. That is, the piezoelectric layer 62 comprising an AlN film of 1.2 μm in thickness was formed on the lower electrode 61. The formation of the AlN film was carried out by using the RF magnetron sputtering method at a substrate temperature of 400° C. under the condition that Al was used as sputtering target and the mixture gas of Ar and $N_2$ was used as sputter gas. The surface roughness of the AlN film thus formed was measured, and the result was that the RMS variation of the height was equal to 14 nm which was not more than 5% of the film thickness. With respect to the surface of the upper electrode 63, the waviness height at the measurement length of 150 μm was measured, so that the it was equal to 0.2 μm which was not more than 25% of the thickness of the piezoelectric layer 62 and also not more than 0.5% of the measurement length.

Further, the thin film XRD analysis was conducted on the piezoelectric layer 62 thus achieved, so that the c-axis of the film was inclined at an angle of 88.5 degrees with respect to the film surface. Further, the orientation was examined on the basis of the rocking curve, so that the full width at half maximum of the peak was equal to 2.8 degrees and excellent orientation was exhibited.

The electromechanical coupling coefficient $k_t^2$ of the acoustic resonator thus achieved was equal to 6.5%, and the acoustic quality factor was equal to 900. The construction of FBAR achieved in EXAMPLE 2 and the characteristics thereof as the acoustic resonator are shown in Table 1.

COMPARATIVE EXAMPLE 2

An acoustic resonator was manufactured in the same manner as EXAMPLE 2 except that the surface of the PSG sacrificial layer 55 was polished so that the R1S variation of the height thereof (surface roughness) was equal to 70 nm.

The surface roughness of the Mo film of the lower electrode 61 was measured, and the result was that the RMS variation of the height was equal to 85 nm. Further, the surface roughness of the AlN film was measured, and the result was that the RMS variation of the height was equal to 80 nm (exceeding 5% of the film thickness). With respect to the surface of the upper electrode 63, the waviness height at the measurement length of 150 μm was investigated, so that it was equal to 1.25 μm (exceeding 0.5% of the measurement length).

Further, the thin film XRD analysis was conducted on the piezoelectric layer 62 thus achieved, so that the c-axis of the film was greatly inclined at an angle of 83.0 degrees with respect to the film surface. The orientation was examined on the basis of the rocking curve, so that the full width at half maximum of the peak was equal to 8.5 degrees.

The electromechanical coupling coefficient $k_t^2$ of the acoustic resonator thus achieved was equal to 3.5%, and the acoustic quality factor thereof was equal to 450. The construction of FBAR achieved in COMPARATIVE EXAMPLE 2 and the characteristics thereof as the acoustic resonator are shown in Table 1.

EXAMPLE 3

A thin film bulk acoustic resonator was manufactured in the same manner as shown in FIGS. 3 to 5 and FIGS. 9 to 10.

First, a structure shown in FIG. 5 was achieved in the same manner as EXAMPLE 1. However, the surface of the PSG sacrificial layer 55 remaining in the pit 52 was polished with slurry containing fine polishing particles so that the RMS variation of the height of the surface was equal to 5 nm.

Subsequently, as shown in FIG. 9, the insulating layer 54 comprising a SiO$_2$ film of 500 nm in thickness was formed on the substrate by the CVD method so that the surface of the PSG sacrificial layer 55 was also covered by the insulating layer 54. The surface roughness of the insulating layer 54 thus formed was measured, so that the RMS variation of the height was equal to 10 nm.

Subsequently, as in the case of EXAMPLE 1, the lower electrode 61 comprising a Mo film was formed on the insulating layer 54 as shown in FIG. 10. The surface roughness of the Mo film thus formed was measured, so that the RMS variation of the height was equal to 15 nm.

Subsequently, the piezoelectric layer 62 comprising a ZnO film was formed on the lower electrode 61 in the same manner as EXAMPLE 1. The surface roughness of the ZnO film thus formed was measured, so that the RMS variation of the height was equal to 10 nm (not more than 5% of the film thickness). The ZnO film was patterned into a predetermined shape by wet etching to achieve the piezoelectric layer 62.

Subsequently, the upper electrode 63 comprising a Mo film was formed on the piezoelectric layer 62 in the same manner as EXAMPLE 1. With respect to the surface of the upper electrode 63, the waviness height at the measurement length 150 μm was investigated, so that it was equal to 0.2 μm (not more than 25% of the thickness of the piezoelectric layer 62 and also not more than 0.5% of the measurement length).

Subsequently, a via hole was formed at the exposed portion of the insulating layer 54 so as to reach the PSG sacrificial layer 55, and etching was carried out through the via hole with dilute H$_2$O:HF solution to remove the PSG sacrificial layer 55, thereby forming a structure that the stack structure having the insulating layer 54 and the sandwich structure 60 of Mo/ZnO/Mo was suspended over the pit 52.

The thin film XRD analysis was conducted on the piezoelectric layer 62 thus achieved, so that the c-axis of the film was inclined at an angle of 88.5 degrees with respect to the film surface. Further, the orientation was investigated on the basis of the rocking curve, so that the full width at half maximum of the peak was equal to 2.3 degrees and excellent orientation was exhibited.

With respect to the acoustic resonator thus achieved, the impedance characteristic between the upper electrode 63 and the lower electrode 61 was measured by using a microwave prober, the resonant frequency f$_r$ and the antiresonant frequency f$_a$ were measured, and the electromechanical, coupling coefficient k$_t^2$ was calculated on the basis of these measurement values. The electromechanical coupling coefficient k$_t^2$ was equal to 4.5%, and the acoustic quality factor was equal to 650. The construction of FBAR achieved in EXAMPLE 3 and the characteristics thereof as the acoustic resonator are shown in Table 1.

COMPARATIVE EXAMPLE 3

An acoustic resonator was manufactured in the same manner as EXAMPLE 3 except that the surface of the PSG sacrificial layer 55 was polished so that the RMS variation of the height was equal to 70 nm.

The surface roughness of the SiO$_2$ film of the insulating layer 54 was measured, so that the RMS variation of the height was equal to 85 nm. The surface roughness of the Mo film of the lower electrode 61 was measured, so that the RMS variation of the height was equal to 90 nm. The surface roughness of the ZnO film was measured, so that the RMS variation of the height was equal to 85 nm (exceeding 5% of the film thickness). With respect to the surface of the upper electrode 63, the waviness height at the measurement length of 150 μm was examined, so that it was equal to 1.0 μm (exceeding 0.5% of the measurement length).

The thin film XRD analysis was conducted on the piezoelectric layer 62 thus achieved, so that the c-axis of the film was greatly inclined at an angle of 83.0 degrees with respect to the film surface. Further, the orientation was investigated on the basis of the rocking curve, so that the full width at half maximum of the peak was equal to 9.5 degrees.

The electromechanical coupling coefficient k$_t^2$ of the acoustic resonator thus achieved was equal to 2.8%, and the acoustic quality factor was equal to 360. The construction of FBAR achieved in COMPARATIVE EXAMPLE 3 and the characteristics thereof as the acoustic resonator are shown in Table 1.

EXAMPLE 4

An acoustic resonator was manufactured in the same manner as EXAMPLE 2 with the exception of a manner of forming the upper electrode 63. That is, after the Mo film of 100 nm in thickness was formed on the piezoelectric layer 62 in the same manner as EXAMPLE 2, a Mo film of 20 nm in thickness was formed on the 100 nm-thick Mo film in an area extending inward from the outer edge thereof by a distance of 30 μm (i.e., the width of the area is equal to 30 μm) by the lift-off method, thereby forming the upper electrode 63 as shown in FIG. 11.

With respect to the surface of the center portion 631 of the upper electrode 63, the waviness height at the measurement length of 100 μm was investigated, so that it was equal to 0.15 μm (not more than 25% of the film thickness of the piezoelectric layer 62 and not more than 0.5% of the measurement length).

The electromechanical coupling coefficient k$_t^2$ of the acoustic resonator thus achieved was equal to 7.5%, and the acoustic quality factor was equal to 950. The construction of FBAR achieved in EXAMPLE 4 and the characteristics thereof as the acoustic resonator are shown in Table 1.

EXAMPLE 5

A thin film bulk acoustic resonator was manufactured in the same manner as shown in FIGS. 3 to 8.

First, the surface of a Si wafer 51 was coated with a $SiO_2$ protection film, and the protection film was etched to have a predetermined pattern for formation of a recess, thereby forming a mask for etching the Si wafer 51. Thereafter, wet etching was carried out by using the mask to form a pit or cavity or recess of 3 μm in depth and 150 μm in width as shown in FIG. 3. This etching was carried out in the same manner as EXAMPLE 1.

Thereafter, the $SiO_2$ pattern mask was removed by the wet etching, and a $Si_3N_4$ layer 53 of 200 nm in thickness was formed on the surface of the Si wafer 51 as shown in FIG. 3, thereby achieving a structure that the pit 52 was formed on the substrate comprising the Si wafer 51 and the $Si_3N_4$ layer 53. The deposition of the $Si_3N_4$ layer 53 was carried out at 800° C. by the low-pressure CVD method using monosilane ($SiH_4$) and ammonia ($NH_3$) as raw materials.

Subsequently, as shown in FIG. 4, a PSG sacrificial layer 55 of 5 μm in thickness was deposited on the $Si_3N_4$ layer 53 having the pit 52 formed therein. This deposition was carried out at 450° C. by the thermal CVD method using tetraethoxysilane or silicon tetraethoxide ($Si(OC_2H_5)_4$) and trimethyl phosphate ($PO(OCH_3)_3$) as raw materials. Further, the PSG sacrificial layer thus deposited was subjected to heat treatment at 850° C. for 20 minutes under the 1% oxygen/nitrogen mixture atmosphere to be reflowed, so that the hardness of the PSG sacrificial layer was increased.

Subsequently, the structure shown in FIG. 5 was achieved in the same manner as EXAMPLE 1. Proper polishing particles were selected so that the RMS variation of the height of the surface of the PSG sacrificial layer 55 remaining in the recess 52 was equal to 5 nm.

Subsequently, the lower electrode 61 comprising a Mo film was formed as shown in FIG. 6 in the same manner as EXAMPLE 1. The surface roughness of the Mo film thus formed was measured, so that the RMS variation of the height was equal to 13 nm.

Subsequently, a piezoelectric layer 62 comprising an AlN film of 1.2 μm in thickness was formed on the lower electrode 61. The surface roughness of the AlN film thus formed was measured, so that the RMS variation of the height was equal to 10 nm (not more than 5% of the film thickness).

Subsequently, the upper electrode 63 comprising a Mo film was formed on the piezoelectric layer 62 in the same manner as EXAMPLE 1. With respect to the surface of the upper electrode 63, the waviness height at the measurement length of 150 μm was examined, so that it was equal to 0.15 μm (not more than 25% of the thickness of the piezoelectric layer 62 and not more than 0.5% of the measurement length).

Subsequently, in the same manner as EXAMPLE 1, the PSG sacrificial layer 55 was removed, thereby forming a structure that the sandwich structure 60 of Mo/AlN/Mo was suspended over the pit 52 as shown in FIG. 8.

The thin film XRD analysis was conducted on the piezoelectric layer 62 thus achieved, so that the c-axis of the film was inclined at an angle of 89.5 degrees with respect to the film surface. The orientation was examined on the basis of the rocking curve, so that the full width at half maximum (FWHM) of the peak was equal to 2.2 degrees and excellent orientation was exhibited.

With respect to the acoustic resonator thus achieved, the impedance characteristic between the upper electrode 63 and the lower electrode 61 was measured by using a microwave prober, the resonant frequency $f_r$ and the antiresonant frequency $f_a$ were measured, and the electromechanical coupling coefficient $k_t^2$ was calculated on the basis of these measurement values. The electromechanical coupling coefficient $k_t^2$ was equal to 6.7%, and the acoustic quality factor was equal to 980. The construction of FBAR achieved in EXAMPLE 5 and the characteristics thereof as the acoustic resonator are shown in Table 1.

EXAMPLE 6

A thin film bulk acoustic resonator was manufactured in the same manner as shown in FIGS. 3 to 5 and FIGS. 9 and 10.

First, a structure shown in FIG. 5 was achieved in the same manner as EXAMPLE 5. However, by selecting proper polishing particles, the surface roughness of the PSG sacrificial layer 55 remaining in the pit 52 was set so that the RMS variation of the height was equal to 10 nm.

Subsequently, as shown in FIG. 9, the insulating layer 54 comprising $Si_3N_4$ film of 500 nm in thickness was formed on the substrate so that the surface of the PSG sacrificial layer 55 was also covered by the insulating layer 54. The deposition of the insulating layer 54 comprising the $Si_3N_4$ film was carried out at 800° C. by using the low-pressure CVD method using monosilane ($SiH_4$) and ammonia ($NH_3$) as raw materials. The surface roughness of the insulating layer 54 thus formed was measured, so that the RMS variation of the height was equal to 12 nm.

Subsequently, the lower electrode 61 comprising a Mo film was formed on the insulating layer 54 in the same manner as EXAMPLE 5 as shown in FIG. 10. The surface roughness of the Mo film thus formed was measured, so that the RMS variation of the height was equal to 17 nm.

Subsequently, the piezoelectric layer 62 comprising an AlN film was formed on the lower electrode 61. The surface roughness of the AlN film thus formed was measured, so that the RMS variation of the height was equal to 15 nm (not more than 5% of the film thickness).

Subsequently, the upper electrode 63 comprising a Mo film was formed on the piezoelectric layer 62 in the same manner as EXAMPLE 5. With respect to the surface of the upper electrode 63, the waviness height at the measurement length of 150 μm was examined, so that it was equal to 0.21 μm (not more than 25% of the thickness of the piezoelectric layer 62 and not more than 0.5% of the measurement length).

Subsequently, in the same manner as EXAMPLE 3, the PSG sacrificial layer 55 was removed, thereby forming a structure that the stack structure of the insulating layer 54 and the sandwich structure 60 of Mo/AlN/Mo are suspended over the pit 52 as shown in FIG. 10.

The thin film XRD analysis was conducted on the piezoelectric layer 62 thus achieved, so that the c-axis of the film was inclined at an angle of 88.4 degrees with respect to the film surface. Further, the orientation was examined on the basis of the rocking curve, so that the full width at half maximum (FWHM) of the peak was equal to 2.8 degrees and excellent orientation was exhibited.

With respect to the acoustic resonator thus achieved, the impedance characteristic between the upper electrode 63 and the lower electrode 61 was measured by using a microwave prober, the resonant frequency $f_r$ and the antiresonant frequency $f_a$ were measured, and the electromechanical coupling coefficient $k_t^2$ was calculated on the basis of these measurement values. The electromechanical coupling coefficient $k_t^2$ was equal to 5.2%, and the acoustic quality factor was equal to 700. The construction of FBAR achieved in EXAMPLE 6 and the characteristics thereof as the acoustic resonator are shown in Table 1.

EXAMPLE 7

A thin film bulk acoustic resonator was manufactured in the manner as shown in FIGS. 15 to 21.

First, the surface of a Si wafer 51 was coated with a SiO$_2$ protection film, and the protection film was etched to have a predetermined pattern for formation of a pit or cavity or recess, thereby forming a mask for etching of the Si wafer 51. Thereafter, wet etching was conducted by using the mask to form a pit or cavity or recess of 20 µm in depth as shown in FIG. 15. The etching was carried out by using 5wt % KOH water solution as etching fluid at a fluid temperature of 70° C. Alternatively, the depth of the pit may be set to 3 µm.

Thereafter, a SiO$_2$ layer 53 was formed on the surface of the wafer 51 again by thermal oxidation, thereby achieving the structure that the pit 52 was formed on the substrate comprising the Si wafer 51 and the SiO$_2$ layer 53.

Thereafter, a Cr film was formed on the surface (upper surface) of the substrate, and then subjected to a pattern etching treatment so that only a portion of the Cr film that surrounds the pit 52 is left in the annular form, whereby an adhesion electrode layer or adherence electrode layer 161 comprising the Cr film was formed so as to surround the pit 52. The formation of the Cr film was carried out by a DC magnetron sputtering method under the condition that Ar was used as sputter gas and the substrate temperature was set to the room temperature. The Cr adhesion electrode layer 161 was formed so that the area (S1) of the face of the upper surface thereof serving as the contact face with the lower electrode layer was equal to 4500 µm$^2$ and the film thickness was equal to 100 nm.

Figure 17:
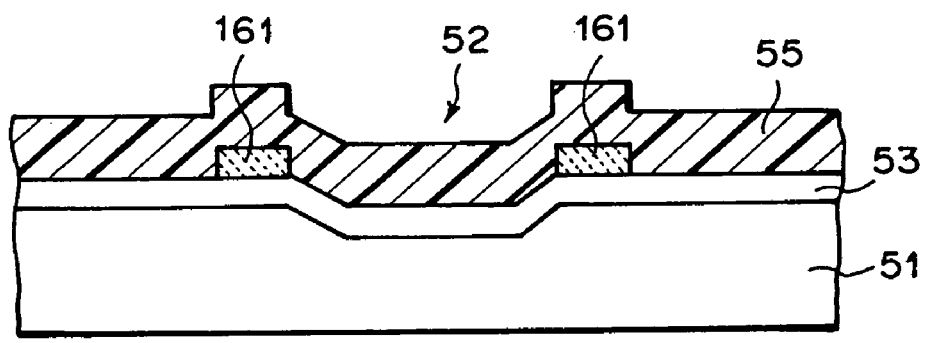
FIG. 17 is a schematic cross-sectional view showing FBAR and the method of producing FBAR according to the present invention.

Thereafter, as shown in FIG. 17, PSG was deposited on the SiO$_2$ layer 53 having the pit 52 formed thereon and the Cr adhesion electrode layer 61 at 450° C. by using silane and phosphine (PH$_3$). Alternatively, the PSG layer thus deposited may be subjected to heat treatment at 850° C. for 20 minutes under the 1% oxygen/nitrogen mixture atmosphere to be reflowed, thereby increasing the hardness thereof.

Subsequently, as shown in FIG. 18, the surface of PSG layer thus deposited was polished to remove a portion of the PSG layer on the adhesion electrode layer 161, the surface of the PSG layer 55 was polished by using slurry containing fine polishing particles and then the surface of the Cr adhesion electrode layer 161 was cleaned by an reverse sputtering treatment. As a result, the surface of the PSG sacrificial layer 55 was treated to have such surface roughness that the RMS variation of the height was equal to 8 nm.

Thereafter, as shown in FIG. 19, a lower electrode layer 162 of Au was formed on the Cr adhesion electrode layer 161 and the PSG sacrificial layer 55. The lift-off method was used for the patterning of the lower electrode layer 162 to achieve the lower electrode layer 162 having a predetermined shape with an outer peripheral edge corresponding to the outer peripheral edge of the Cr adhesion electrode layer 161. The formation of Au film was conducted by using the DC magnetron sputtering method under the condition that Ar was used as sputter gas and the substrate temperature was set to the room temperature. The lower electrode layer 162 was formed so that the plane area (S2) was equal to 27225 µm$^2$ and the film thickness was equal to 100 nm. The surface roughness of the Au film achieved was examined, so that the RMS variation of the height was equal to 7 nm.

Subsequently, the PSG sacrificial layer remaining around the lower electrode layer 162 was removed, and the piezoelectric thin film layer 163 of ZnO was formed on the lower electrode layer 162. The formation of the ZnO film was carried out by using the RF magnetron sputtering method under the condition that ZnO was used as sputtering target, Ar—O$_2$ mixture gas in which a ratio of Ar and O$_2$ was equal to 9:1 was used as sputtering gas, the sputter gas pressure was equal to 5 mTorr and the substrate temperature was set to 400° C. The thickness of the ZnO film was equal to 1.0 µm. The surface roughness of the ZnO film was examined, so that the RMS variation of the height was equal to 4 nm.

Subsequently, the ZnO piezoelectric thin film layer 163 was subjected to the wet etching to have a predetermined pattern having an outer peripheral edge which corresponds to the outer peripheral edge of the Cr adhesion electrode layer 161 and the outer peripheral edge of the lower electrode layer 162 except for an opening portion required to draw out a coupling electrode. Then, an upper electrode layer 164 of Au was formed on the ZnO piezoelectric thin film 163. The upper electrode layer 164 is patterned into a predetermined shape by the lift-off method so that the outer peripheral edge thereof is located at a more internal side than the inner peripheral edge of the Cr contact electrode layer 161 (see FIG. 21). The formation of the Au film was conducted by using the DC magnetron sputtering method under the condition that Ar was used as sputter gas and the substrate temperature was set to the room temperature. The thickness of the Au film was set to 100 nm.

Subsequently, a small hole penetrating through the upper electrode layer 164, the piezoelectric thin film layer 163 and the lower electrode layer 162 was formed by RIE (Reactive Ion Etching) so as to extend downwardly from the peripheral portion of the upper electrode layer 164, and etching with dilute H$_2$O:HF solution was conducted to remove the PSG sacrificial layer 55, thereby forming a structure that the sandwich structure 60 of Cr/Au/ZnO/Au was suspended over the pit 52 as shown in FIG. 20. A peeling test using a scotch tape was conducted on the sandwich structure 60 thus achieved, so that no peeling was observed between the sandwich structure 60 and the substrate.

Further, the thin film XRD analysis was conducted on the ZnO piezoelectric thin film layer 163 achieved, so that the c-axis of the film was inclined at an angle of 88.6 degrees with respect to the film surface. The orientation was examined on the basis of the rocking curve, so that the full width at half maximum (FWHM) of the peak of (0002) was equal to 2.3 degrees and excellent orientation was exhibited.

Further, with respect to the thin film bulk acoustic resonator thus achieved as shown in FIGS. 20 and 21, the impedance characteristics between the upper electrode layer 164 and the lower electrode layer 162 and adhesion electrode layer 161 was measured by using the microwave prober, the resonant frequency f$_r$ and the antiresonant frequency f$_a$ were measured, and the electromechanical coupling coefficient $k_t^2$ was calculated on the basis of these measurement values. In this case, "spurious" was not excited, the electromechanical coupling coefficient $k_t^2$ was equal to 5.5%, and the acoustic quality factor was equal to 1145. The construction and adhesion strength of FBAR achieved in EXAMPLE 7 and the characteristics thereof as the acoustic resonator are shown in Table 2.

EXAMPLE 8

A thin film bulk acoustic resonator was manufactured in the same manner as EXAMPLE 7 except that Ti was used for the adhesion electrode layer 161 in place of Cr. The formation of the Ti film was carried out by using the DC magnetron sputtering method under the condition that Ti was used as sputtering target, Ar was used as sputter gas and the substrate temperature was set to the room temperature. The thickness of the Ti film was equal to 20 nm. The surface roughness of the ZnO piezoelectric thin film layer 163 was examined, so that the RMS variation of the height was equal to 9 nm. The peeling test using a scotch tape was conducted, so that no peeling was observed between the substrate and the sandwich structure 60. Further, the thin film XRD analysis was conducted, so that the c-axis of the ZnO piezoelectric thin film layer 163 was inclined at an angle of 89.2 degrees with respect to the film surface. Further, the orientation was examined on the basis of the rocking curve, so that the full width at half maximum of the peak was equal to 2.1 degrees and excellent orientation was exhibited.

In the thin film bulk acoustic resonator thus achieved, there was no "spurious" excitation, the electromechanical coupling coefficient $k_t^2$ was equal to 5.9% and the acoustic quality factor was equal to 772. The construction and the adhesion strength of FBAR achieved in EXAMPLE 8 and the characteristics thereof as the acoustic resonator are shown in Table 2.

EXAMPLE 9

A thin film bulk acoustic resonator was manufactured in the same manner as EXAMPLE 7 except that in place of Au, Pt was used for the lower electrode layer 162 and the upper electrode layer 164, and the thickness of the Cr adhesion electrode layer 161 was equal to 60 nm. The formation of the Pt film was carried out by using the DC magnetron sputtering method under the condition that Pt was used as sputtering target, Ar was used as sputter gas and the substrate temperature was set to the room temperature. The film thickness of the Pt film was set to 100 nm. The surface roughness of the ZnO piezoelectric thin film layer 163 was examined, so that the RMS variation of the height was equal to 6 nm. Further, the peeling test using a scotch tape was conducted, so that no peeling was observed between the substrate and the sandwich structure 60. Further, the thin film XRD analysis was conducted, so that the c-axis of the ZnO piezoelectric thin film layer 163 was inclined at an angle of 88.8 degrees with respect to the film surface. Further, the orientation was examined on the basis of the rocking curve, so that the full width at half maximum of the peak was equal to 2.5 degrees and thus excellent orientation was exhibited.

In the thin film bulk acoustic resonator thus achieved, there was no "spurious" excitation, the electromechanical coupling coefficient $k_t^2$ was equal to 5.2% and the acoustic quality factor was equal to 898. The construction and the adhesion strength of FBAR achieved in EXAMPLE 9 and the characteristics thereof as the acoustic resonator are shown in Table 2.

EXAMPLE 10

A thin film bulk acoustic resonator was manufactured in the same manner as EXAMPLE 7 except that in place of Cr, Ni was used for the adhesion electrode layer 161 and the plane area S1 thereof was enlarged to 15000 μm² and the ratio S1/S2 (S2: the plane area of the lower electrode layer 162) was set to 0.55. The formation of the Ni film was carried out by using the DC magnetron sputtering method under the condition that Ni was used as sputtering target, Ar was used as sputter gas and the substrate temperature was set to the room temperature. The thickness of the Ni film was set to 50 nm. The surface roughness of the ZnO piezoelectric thin film layer 163 was examined, so that the RMS variation of the height was equal to 11 nm. Further, the peeling test using a scotch tape was conducted, so that no peeling was observed between the substrate and the sandwich structure 60. Further, the thin film XRD analysis was conducted, so that the c-axis of the ZnO piezoelectric thin film layer 163 was inclined at an angle of 89.0 degrees with respect to the film surface. Further, the orientation was examined on the basis of the rocking curve, so that the full width at half maximum of the peak was equal to 2.9 degrees and thus excellent orientation was exhibited.

In the thin film bulk acoustic resonator thus achieved, there was no "spurious" excitation, the electromechanical coupling coefficient $k_t^2$ was equal to 4.8%. and the acoustic quality factor was equal to 707. The construction and the adhesion strength of FBAR achieved in EXAMPLE 10 and the characteristics thereof as the acoustic resonator are shown in Table 2.

EXAMPLE 11

A thin film bulk acoustic resonator was manufactured in the same manner as EXAMPLE 8 except that in place of Au, Pt was used for the lower electrode layer 162 and the upper electrode layer 164, in place of ZnO, AlN was used for the piezoelectric thin film layer 163, and the plane area S1 of the Ti adhesion electrode layer 161 was set to 4000 μm² and the thickness thereof was equal to 30 nm. The formation of the Pt film was carried out in the same manner as EXAMPLE 9. The formation of the AlN film was carried out by using the RF magnetron sputtering method under the condition that Al was used as sputtering target, Ar—$N_2$ mixture gas (Ar:$N_2$=1:1) was used as sputter gas and the substrate temperature was set to 400° C. The thickness of the AlN film was set to 1.4 μm. The surface roughness of the AlN film thus achieved was examined, so that the RMS variation of the height was equal to 7 nm. Further, the peeling test using a scotch tape was conducted, so that no peeling was observed between the substrate and the sandwich structure 60. Further, the thin film XRD analysis was conducted, so that the c-axis of the AlN piezoelectric thin film layer 163 was inclined at an angle of 90.0 degrees with respect to the film surface. Further, the orientation was examined on the basis of the rocking curve, so that the full width at half maximum of the peak was equal to 2.7 degrees and thus excellent orientation was exhibited.

In the thin film bulk acoustic resonator thus achieved, there was no "spurious" excitation, the electromechanical coupling coefficient $k_t^2$ was equal to 6.4% and the acoustic quality factor was equal to 984. The construction and the adhesion strength of FBAR achieved in EXAMPLE 11 and the characteristics thereof as the acoustic resonator are shown in Table 2.

EXAMPLE 12

A thin film bulk acoustic resonator was manufactured in the same manner as EXAMPLE 11 except that Cr was used for the adhesion electrode layer 161, Mo was used for the upper and lower electrode layers 162, 164, and the plane area S1 of the Cr adhesion electrode layer 161 was set to 5000 μm² and the thickness thereof was set to 40 nm. The surface roughness of the AlN film thus achieved was examined, so that the RMS variation of the height was equal to 5 nm. Further, the peeling test using a scotch tape was conducted, so that no peeling was observed between the substrate and the sandwich structure 60. Further, the thin film XRD analysis was conducted, so that the c-axis of the AlN piezoelectric thin film layer 163 was inclined at an angle of 89.8 degrees with respect to the film surface. Further, the orientation was examined on the basis of the rocking curve, so that the full width at half maximum of the peak was equal to 2.9 degrees and thus excellent orientation was exhibited.

In the thin film bulk acoustic resonator thus achieved, there was no "spurious" excitation, the electromechanical coupling coefficient $k_t^2$ was equal to 6.1% and the acoustic quality factor was equal to 1140. The construction and the adhesion strength of FBAR achieved in EXAMPLE 12 and the characteristics thereof as the acoustic resonator are shown in Table 2.

COMPARATIVE EXAMPLE 4

A thin film bulk acoustic resonator was manufactured in the same manner as EXAMPLE 7 except that PSG was deposited on the structure that a pit 52 was formed on a substrate comprising Si wafer 51 and a SiO$_2$ layer 53, the surface of the PSG layer thus formed was polished to remove a portion of the PSG layer in the area out of the recess 52, the surface of the PSG layer in the area of the pit 52 was treated to have such surface roughness that the RMS variation of the height was equal to 38 nm, a Cr film and an Au film were formed on the PSG layer and these films were patterned in the same pattern to achieve the structure that the adhesion electrode layer 161 was joined to the whole surface of the lower electrode layer 162.

The surface roughness of the ZnO film thus achieved was examined, so that the RMS variation of the height was equal to 30 nm. Further, the peeling test using a scotch tape was conducted, so that no peeling was observed between the substrate and the sandwich structure 60. Further, the thin film XRD analysis was conducted, so that the c-axis of the ZnO piezoelectric thin film layer 163 was inclined at an angle of 87.5 degrees with respect to the film surface. Further, the orientation was examined on the basis of the rocking curve, so that the full width at half maximum of the peak was equal to 4.8 degrees, which indicated that the orientation was more degraded by 2.5 degrees than that of EXAMPLE 7.

In the thin film bulk acoustic resonator thus achieved, "spurious" was excited, the electromechanical coupling coefficient $k_t^2$ was equal to 2.5% and the acoustic quality factor was equal to 404. The construction and the adhesion strength of FBAR achieved in COMPARATIVE EXAMPLE 4 and the characteristics thereof as the acoustic resonator are shown in Table 2.

COMPARATIVE EXAMPLE 5

A thin film bulk acoustic resonator was manufactured in the same manner as COMPARATIVE EXAMPLE 4 except that no adhesion electrode layer 161 was provided. However, the surface of the PSG layer in the area of the pit 52 was treated so that the RMS variation of the height was equal to 33 nm.

The surface roughness of the ZnO film thus achieved was examined, so that the RMS variation of the height was equal to 23 nm. The thin film XRD analysis was conducted, so that the c-axis of the ZnO piezoelectric thin film layer 163 was inclined at an angle of 88.4 degrees with respect to the film surface. The orientation was examined on the basis of the rocking curve, so that the full width at half maximum of the peak was equal to 4.2 degrees. Further, in the peeling test using a scotch tape, peeling was observed between the substrate and the sandwich structure 60.

In the thin film bulk acoustic resonator thus achieved, "spurious" was excited, the electromechanical coupling coefficient $k_t^2$ was equal to 3.2 and the acoustic quality factor was equal to 446. The construction and the adhesion strength of FBAR achieved in COMPARATIVE EXAMPLE 5 and the characteristics thereof as the acoustic resonator are shown in Table 2.

EXAMPLES 13 TO 15

Piezoelectric thin film resonators each having the structure shown in FIGS. 22 and 23 were manufactured as follows.

A silicon oxide (SiO$_2$) layer of 0.3 to 0.6 μm in thickness was formed on each of the upper surface and lower surface of a (100) Si substrate 112 of 250 μm in thickness by the thermal oxidation method. The SiO$_2$ layer at the upper surface side was used as the insulating layer 13. Further, the SiO$_2$ layer at the lower surface side was treated to have a mask pattern for forming a via hole for the substrate 112 as described later.

A Mo layer of 0.1 μm in thickness was formed on the surface of the insulating layer 13 by the DC magnetron sputtering method, and patterned by the photolithography technique to thereby form a lower electrode 15. The main body portion 15*a* of the lower electrode 15 was designed in an approximately rectangular shape having a plane size of 140×160 μm. Further, an AlN thin film of 1.3 to 2.0 μm in thickness, the crystal face of which was oriented in the C-axis, was formed on the Mo lower electrode 15. The formation of the AlN thin film was conducted by the reactive RF magnetron sputtering method. The AlN thin film was patterned into a predetermined shape by a wet etching treatment using heated phosphoric acid to form a piezoelectric film 16. Thereafter, an upper electrode 17 formed of Mo and having a thickness of 0.1 μm was formed by using the DC magnetron sputtering method and the lift-off method. The main body portion 17*a* of the upper electrode 17 was designed in an approximately rectangular shape having a plane size of 140×160 μm and disposed at the position corresponding to the main body portion 15*a* of the lower electrode.

Subsequently, the side of the above achieved structure with the upper and lower electrodes 15, 17 and the piezoelectric film 16 was coated with PMMA resin, and the portion of the Si substrate 112 corresponding to the vibrating portion 121 was etched away with KOH water solution by using as a mask the patterned SiO$_2$ layer formed on the lower surface of the Si substrate 112, thereby forming a via hole 120 serving as a cavity. The size of the opening of the via hole formed on the upper surface of the Si substrate 112 (the plane size of the vibrating portion 21) was set to 200×200 μm.

With respect to the thin film piezoelectric resonators (FBARs) achieved in the above process, the impedance between the electrode terminals 15*b*, 17*b* of the thin film piezoelectric resonator was measured by using a microwave prober produced by Cascade Microtech Incorporated Company and a network analyzer, and the electromechanical coupling coefficient $k_t^2$, the frequency temperature characteristic $\tau_f$, and the acoustic quality factor Q were determined on the basis of the measurement values of the resonant frequency $f_r$ and the antiresonant frequency $f_a$. The fundamental frequency, the electromechanical coupling coefficient $k_t^2$, the frequency temperature characteristic $\tau_f$ and the acoustic quality factor Q of the thickness vibration of the piezoelectric thin film resonator achieved are shown in Table 3.

EXAMPLES 16 TO 18

Piezoelectric thin film resonators each having the structure shown in FIGS. 24 and 25 were manufactured as follows.

That is, the same process as EXAMPLES 13 to 15 was carried out except that after the upper electrode 17 was formed and before the via hole 120 was formed, a SiO$_2$ layer of 0.1 to 0.3 µm was formed on the upper electrode 17 by the RF magnetron sputtering method and patterned in conformity with the vibrating portion 121 to form an upper insulating layer 18, and also the thickness of the lower insulating layer 13 and the thickness of the piezoelectric film 16 were set as shown in Table 3.

With respect to the thin film piezoelectric resonators (FBARs) achieved in the above process, the fundamental frequency of the thickness vibration, the electromechanical coupling coefficient $k_t^2$, the frequency temperature characteristic $\tau_f$ and the acoustic quality factor Q were determined in the same manner as EXAMPLES 13 to 15, and these data are shown in Table 3.

EXAMPLES 19 TO 22

Piezoelectric thin film resonators each having the structure shown in FIGS. 26 and 27 and piezoelectric thin film resonators each having the structure shown in FIGS. 28 and 29 were manufactured as follows.

That is, the same process [for EXAMPLES 19, 20] as EXAMPLES 13 to 15 and the same process [for EXAMPLES 21, 22] as EXAMPLES 16 to 18 were carried out except that the thickness of the upper and lower insulating layers 13, 18 and the thickness of the piezoelectric film 16 were set as shown in Table 3 and also except for the shape and size of the upper and lower electrodes 15, 17. The lower electrode 15 was designed in a rectangular shape having a plane size of 150×300 µm extending so as to contain the area corresponding to the vibrating portion 121, and the upper electrode 17 were so designed that main body portions 17Aa, 17Ba having an approximately rectangular shape of 70×90 µm in plane size were disposed so as to be spaced from each other at a distance of 20 µm.

With respect to the thin film piezoelectric resonators (FBARs) achieved in the above process, the fundamental frequency of the thickness vibration, the electromechanical coupling coefficient $k_t^2$, the frequency temperature characteristic $\tau_f$ and the acoustic quality factor Q were determined in the same manner as EXAMPLES 13 to 15 and EXAMPLES 16 to 18, and these data are shown in Table 3.

EXAMPLES 23 TO 25

Piezoelectric thin film resonators each having the structure shown in FIGS. 22 and 23 and piezoelectric thin film resonators each having the structure shown in FIGS. 24 and 25 were manufactured as follows.

That is, the same process [for EXAMPLES 23, 24] as EXAMPLE 13 and the same process [for EXAMPLES 25] as EXAMPLE 16 were carried out except that the thickness of the piezoelectric film 16 and the thickness of the upper and lower insulating layers 13, 18 were set as shown in Table 3.

With respect to the thin film piezoelectric resonators (FBARs) achieved in the above process, the fundamental frequency of the thickness vibration, the electromechanical coupling coefficient $k_t^2$, the frequency temperature characteristic $\tau_f$ and the acoustic quality factor Q were determined in the same manner as EXAMPLES 13 and EXAMPLE 16, and these data are shown in Table 3.

COMPARATIVE EXAMPLES 6 AND 7

The same process as EXAMPLE 13 was conducted except that in place of Mo, aluminum (Al) was used as the material of the upper and lower electrode layers, and the thickness of the piezoelectric layer and the thickness of the insulating layer 13 were set as shown in Table 3.

With respect to the thin film piezoelectric resonators (FBARs) achieved in the above process, the fundamental frequency of the thickness vibration, the electromechanical coupling coefficient $k_t^2$, the frequency temperature characteristic $\tau_f$ and the acoustic quality factor Q were determined in the same manner as EXAMPLE 13, and these data are shown in Table 3.

COMPARATIVE EXAMPLE 8

The same process as EXAMPLE 13 was carried out except that the insulating layer 13 was left only out of the area corresponding to the vibrating portion 121.

With respect to the thin film piezoelectric resonators (FBARs) achieved in the above process, the fundamental frequency of the thickness vibration, the electromechanical coupling coefficient $k_t^2$, the frequency temperature characteristic $\tau_f$ and the acoustic quality factor Q were determined in the same manner as EXAMPLE 13, and these data are shown in Table 3.

COMPARATIVE EXAMPLES 9 AND 10

The same process as EXAMPLE 13 was carried out except that in place of AlN, zinc oxide (ZnO) was used as the material of the piezoelectric film 16, and the thickness of the piezoelectric film 16 and the thickness of the insulating layer 13 were set as shown in Table 3.

With respect to the thin film piezoelectric resonators (FBARs) achieved in the above process, the fundamental frequency of the thickness vibration, the electromechanical coupling coefficient $k_t^2$, the frequency temperature characteristic $\tau_f$ and the acoustic quality factor Q were determined in the same manner as EXAMPLE 13, and these data are shown in Table 3.

From the above-described results, there can be achieved the piezoelectric thin film resonator having excellent temperature stability of the resonant frequency with keeping the electromechanical coupling coefficient and the acoustic quality factor by joining and adding to the piezoelectric stack structure the insulating layer formed of mainly silicon oxide having a temperature coefficient whose sign is different from that of the resonant frequency of the vibrating portion containing a part of the piezoelectric stack structure comprising the electrodes formed of mainly molybdenum and the piezoelectric film formed of mainly aluminum nitride. Particularly, when it is applied to VCO (piezoelectric thin film resonator), a filter or a transmission/reception duplexer in a high frequency band of 1 GHz or more, the performance thereof can be remarkably improved.

TABLE 1

| | CONSTRUCTION OF FBAR | | | | | | | | | CHARACTERISTIC AS ACOUSTIC RESONATOR | |
|---|---|---|---|---|---|---|---|---|---|---|---|
| | INSULATING LAYER | | LOWER ELECTRODE | | PIEZOELECTRIC LAYER | | | | UPPER ELECTRODE | ELECTRO-MECHANICAL | |
| | MATERIAL | SURFACE ROUGHNESS RMS (nm) | MATERIAL | SURFACE ROUGHNESS RMS (nm) | MATERIAL | SURFACE ROUGHNESS RMS (nm) | c-AXIS DIRECTION (deg) | ROCKING CURVE FWHM (deg) | MATERIAL | WAVINESS HEIGHT (nm) | COUPLING COEFFICIENT $k_t^2$ (%) | ACOUSTIC QUALITY FACTOR Q |
| EX. 1 | none | — | Mo | 15 | ZnO | 11 | 88.5 | 2.5 | Mo | 200 | 5.5 | 700 |
| EX. 2 | none | — | Mo | 15 | AlN | 14 | 88.5 | 2.8 | Mo | 200 | 6.5 | 900 |
| EX. 3 | $SiO_2$ | 10 | Mo | 15 | ZnO | 10 | 88.5 | 2.3 | Mo | 200 | 4.5 | 650 |
| EX. 4 | none | — | Mo | 15 | AlN | 14 | 88.5 | 2.8 | Mo | 150 | 7.5 | 950 |
| EX. 5 | none | — | Mo | 13 | AlN | 10 | 89.5 | 2.2 | Mo | 150 | 6.7 | 980 |
| EX. 6 | $Si_3N_4$ | 12 | Mo | 17 | AlN | 15 | 88.4 | 2.8 | Mo | 210 | 5.2 | 700 |
| COMP. EX. 1 | none | — | Mo | 80 | ZnO | 75 | 85.0 | 7.0 | Mo | 1000 | 3.0 | 400 |
| COMP. EX. 2 | none | — | Mo | 85 | AlN | 80 | 83.0 | 8.5 | Mo | 1250 | 3.5 | 450 |
| COMP. EX. 3 | $SiO_2$ | 85 | Mo | 90 | ZnO | 85 | 83.0 | 9.5 | Mo | 1000 | 2.8 | 360 |

TABLE 2

| | CONSTRUCTION OF FBAR | | | | | | | | | | CHARACTERISTIC AS ACOUSTIC RESONATOR | |
|---|---|---|---|---|---|---|---|---|---|---|---|---|---|
| | ADHESION LAYER | | | LOWER ELECTRODE LAYER | | PIEZOELECTRIC THIN FILM LAYER | | | | MATERIAL OF UPPER ELECTRODE LAYER | ADHESION STRENGTH PEELING TEST | ELECTRO-MECHANICAL | |
| | MATERIAL | PLANE AREA S1 (μm²) | THICKNESS (nm) | MATERIAL | SURFACE ROUGHNESS RMS (nm) | MATERIAL | SURFACE ROUGHNESS RMS (nm) | c-AXIS DIRECTION (deg) | ROCKING CURVE FWHM (deg) | | | COUPLING COEFFICIENT $k_t^2$ (%) | ACOUSTIC QUALITY FACTOR Q |
| EX. 7 | Cr | 4,500 | 100 | Au | 7 | ZnO | 4 | 88.6 | 2.3 | Au | NOT PEELED | 5.5 | 1145 |
| EX. 8 | Ti | 4,500 | 20 | Au | 10 | ZnO | 9 | 89.2 | 2.1 | Au | NOT PEELED | 5.9 | 772 |
| EX. 9 | Cr | 4,500 | 60 | Pt | 9 | ZnO | 6 | 88.8 | 2.5 | Pt | NOT PEELED | 5.2 | 898 |
| EX. 10 | Ni | 15,000 | 50 | Au | 12 | ZnO | 11 | 89.0 | 2.9 | Au | NOT PEELED | 4.8 | 707 |
| EX. 11 | Ti | 4,000 | 30 | Pt | 9 | AlN | 7 | 90.0 | 2.7 | Pt | NOT PEELED | 6.4 | 984 |
| EX. 12 | Cr | 5,000 | 40 | Mo | 8 | AlN | 5 | 89.8 | 2.9 | Mo | NOT PEELED | 6.1 | 1140 |
| COMP. EX. 4 | Cr | 27,225 | 20 | Au | 40 | ZnO | 30 | 87.5 | 4.8 | Au | NOT PEELED | 2.5 | 404 |
| COMP. EX. 5 | — | — | — | Au | 28 | ZnO | 23 | 88.4 | 4.2 | Au | PEELED | 3.2 | 446 |

TABLE 3

| | CONSTRUCTION OF FBAR—FIG. NO. | THICKNESS OF PIEZOELECTRIC THIN FILM (μm) | THICKNESS OF INSULATING LAYER (μm) | | THICKNESS RATIO t'/t | RESONANT FREQUENCY $f_r$ (GHz) | ANTI-RESONANT FREQUENCY $f_a$ (GHz) | ELECTRO-MECHANICAL COUPLING COEFFICIENT $k_t^2$ (%) | FREQUENCY TEMPERATURE COEFFICIENT $\tau_f$ (ppm/°C.) | ACOUSTIC QUALITY FACTOR Q |
|---|---|---|---|---|---|---|---|---|---|---|
| | | | LOWER | UPPER | | | | | | |
| EX. 13 | 22, 23 | 1.60 | 0.50 | — | 0.31 | 2.055 | 2.093 | 4.4 | 3.7 | 1640 |
| EX. 14 | 22, 23 | 2.00 | 0.30 | — | 0.15 | 2.049 | 2.090 | 4.8 | −13.4 | 1720 |
| EX. 15 | 22, 23 | 1.30 | 0.60 | — | 0.46 | 2.118 | 2.155 | 4.2 | 14.5 | 1120 |
| EX. 16 | 24, 25 | 1.60 | 0.30 | 0.20 | 0.31 | 2.030 | 2.076 | 5.3 | 4.2 | 1610 |

TABLE 3-continued

| | CONSTRUCTION OF FBAR- FIG. NO. | THICKNESS OF PIEZOELECTRIC THIN FILM (μm) | THICKNESS OF INSULATING LAYER (μm) | | THICKNESS RATIO t'/t | RESONANT FREQUENCY $f_r$ (GHz) | ANTI-RESONANT FREQUENCY $f_a$ (GHz) | ELECTROMECHANICAL COUPLING COEFFICIENT $k_t^2$ (%) | FREQUENCY TEMPERATURE COEFFICIENT $\tau_f$ (ppm/° C.) | ACOUSTIC QUALITY FACTOR Q |
|---|---|---|---|---|---|---|---|---|---|---|
| | | | LOWER | UPPER | | | | | | |
| EX. 17 | 24, 25 | 1.90 | 0.30 | 0.10 | 0.21 | 2.005 | 2.051 | 5.5 | −5.6 | 1800 |
| EX. 18 | 24, 25 | 1.30 | 0.30 | 0.30 | 0.46 | 2.158 | 2.202 | 4.9 | 14.2 | 1060 |
| EX. 19 | 26, 27 | 1.90 | 0.40 | — | 0.21 | 1.984 | 2.024 | 4.7 | −3.9 | 1670 |
| EX. 20 | 26, 27 | 1.30 | 0.60 | — | 0.46 | 2.141 | 2.179 | 4.3 | 14.4 | 980 |
| EX. 21 | 28, 29 | 1.90 | 0.30 | 0.10 | 0.21 | 1.998 | 2.043 | 5.4 | −5.1 | 1650 |
| EX. 22 | 28, 29 | 1.30 | 0.30 | 0.30 | 0.46 | 2.118 | 2.163 | 5.1 | 14.1 | 940 |
| EX. 23 | 22, 23 | 1.00 | 0.53 | — | 0.53 | 2.525 | 2.568 | 4.1 | 18.5 | 800 |
| EX. 24 | 22, 23 | 2.20 | 0.19 | — | 0.08 | 2.077 | 2.124 | 5.5 | −18.3 | 1720 |
| EX. 25 | 24, 25 | 2.10 | 0.10 | 0.08 | 0.08 | 2.091 | 2.144 | 6.1 | −18.1 | 1880 |
| COMP. EX. 6 | 22, 23 | 1.10 | 0.60 | — | 0.55 | 2.262 | 2.293 | 3.3 | 24.0 | 320 |
| COMP. EX. 7 | 22, 23 | 1.60 | 0.50 | — | 0.31 | 1.774 | 1.800 | 3.5 | −20.5 | 550 |
| COMP. EX. 8 | 22, 23 | 2.20 | — | — | — | 2.318 | 2.375 | 5.8 | −35.0 | 1750 |
| COMP. EX. 9 | 22, 23 | 1.90 | 0.16 | — | 0.08 | 2.136 | 2.171 | 3.9 | −47.4 | 750 |
| COMP. EX. 10 | 22, 23 | 0.90 | 0.80 | — | 0.89 | 1.748 | 1.768 | 2.8 | 23.7 | 210 |

INDUSTRIAL APPLICABILITY

As described above, according to the present invention, the first electrode is formed directly or through the insulating layer on the surface of the sacrificial layer that is smooth at an atomic level so that the RMS variation of the height is not more than 25 nm, preferably not more than 20 nm, whereby the RMS variation of the height of the surface of the first electrode is set to 25 nm or less, preferably to 20 nm or less, and the piezoelectric layer is formed on the surface of the first electrode. Therefore, the crystallinity of the first electrode is improved, and thus the orientation and crystal quality of the piezoelectric layer can be remarkably improved. Accordingly, there can be provided a high-performance thin film bulk acoustic resonator that is excellent in electromechanical coupling coefficient and acoustic quality factor.

Further, as described above, according to the present invention, the adhesion electrode layer is provided between the lower electrode layer and the substrate, and the adhesion electrode layer is joined to the substrate around the pit formed in the substrate. Therefore, occurrence of vibration in the lateral direction in the thin film bulk acoustic resonator can be suppressed, extra "spurious" can be prevented from being superposed on the vibration of the thin film bulk acoustic resonator, so that the resonance characteristic and the quality factor of the thin film bulk resonator and filter can be improved. Further, no adhesion electrode layer exists at the lower side of the center portion of the lower electrode layer (that is, the inside portion surrounded by the adhesion electrode layer), so that the center portion of the lower electrode layer can be formed on the surface of the sacrificial layer having extremely high smoothness and thus the orientation and crystallinity can be enhanced. Accordingly, the piezoelectric thin film layer having excellent orientation and crystallinity can be formed, and the high-performance thin film bulk acoustic resonator having excellent electromechanical coupling coefficient and acoustic quality factor (Q value) can be provided. Still further, by using the adhesion electrode layer, the adhesion force (bonding strength) between the lower electrode layer and the substrate can be increased, so that the range of the materials to be selectively available for the lower electrode layers can be expanded, and the durability of the thin film bulk acoustic resonator can be improved to extend the lifetime thereof.

Further, as described above, according to the piezoelectric thin film resonator of the present invention, the electrodes formed mainly of molybdenum, the piezoelectric film formed mainly of aluminum nitride and the insulating layer formed mainly of silicon oxide or silicon nitride are used in combination, so that the electromechanical coupling coefficient, the acoustic quality factor (Q value) and the frequency temperature characteristic can be improved.

What is claimed is:

1. A method of producing a thin film bulk acoustic resonator having a piezoelectric layer, a first electrode joined to a first surface of the piezoelectric layer, and a second electrode joined to a second surface of the piezoelectric layer, which is located at the opposite side to the first surface, comprising:
    forming a pit on a surface of a substrate;
    filling the pit with a sacrificial layer;
    polishing a surface of the sacrificial layer so that a Root Mean Square (RMS) variation of a height of the surface of the sacrificial layer is equal to 25 nm or less;
    forming the first electrode over a partial area of the surface of the sacrificial layer and a partial area of the surface of the substrate;
    forming the piezoelectric layer on the first electrode so that a RMS variation of a height of the second surface of the piezoelectric layer is equal to 5% or less of a thickness of the piezoelectric layer;
    forming the second electrode on the piezoelectric layer; and
    removing the sacrificial layer from the inside of the pit by etching.

2. The method as claimed in claim 1, wherein the surface of the sacrificial layer is polished so that the RMS variation of the height of the surface of the sacrificial layer is equal to 20 nm or less.

3. The method as claimed in claim 1, wherein the first electrode is formed at a thickness of 150 nm or less, and RMS variation of the height of an upper surface of the first electrode is set to 25 nm or less.

4. The method as claimed in claim 3, wherein the RMS variation of the height of the upper surface of the first electrode is set to 20 nm or less.

5. The method as claimed in claim 1, wherein at least one insulating layer is formed before the first electrode is formed on the sacrificial layer.

6. The method as claimed in claim 1, wherein the second electrode is formed so that a waviness height of a surface of the second electrode is set to 25% or less of the thickness of the piezoelectric layer.

7. The method as claimed in claim 1, wherein the sacrificial layer is subjected to a heat treatment after filling the pit with the sacrificial layer and before polishing the surface of the sacrificial layer.

8. The method as claimed in claim 7, wherein the heat treatment is rapid thermal annealing carried out at a temperature of 750 to 950 degrees Centigrade.

9. The method as claimed in claim 5, wherein the at least one insulating layer is formed so that RMS variation of a height of an uppermost surface of at least one insulating layer is equal to 25 nm or less.

10. The method as claimed in claim 5, wherein a total thickness of the at least one insulating layer is 50 to 1000 nm.

11. The method as claimed in claim 5, wherein the at least one insulating layer is formed so that the thickness t of the piezoelectric layer and the total thickness t' of at least one insulating layer satisfied the following inequality: $0.1 \leq t'/t \leq 0.5$.

12. The method as claimed in claim 1, wherein the pit is formed so that a depth of the pit is 1.5 to 30 μm.

* * * * *